(12) United States Patent
Ogawa

(10) Patent No.: US 7,244,656 B2
(45) Date of Patent: Jul. 17, 2007

(54) THIN FILM CIRCUIT BOARD DEVICE AND METHOD FOR MANUFACTURING THE SAME

(75) Inventor: Tsuyoshi Ogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/965,071

(22) Filed: Oct. 14, 2004

(65) Prior Publication Data

US 2005/0068748 A1 Mar. 31, 2005

Related U.S. Application Data

(62) Division of application No. 10/432,005, filed as application No. PCT/JP02/09648 on Sep. 19, 2002, now Pat. No. 7,199,457.

(30) Foreign Application Priority Data

Sep. 21, 2001 (JP) ............................ P2001-289997

(51) Int. Cl.
*H01L 21/20* (2006.01)
(52) U.S. Cl. ..................... 438/384; 438/239; 438/382; 438/957
(58) Field of Classification Search ........ 438/238–239, 438/250, 382, 384, 957
See application file for complete search history.

(56) References Cited

U.S. PATENT DOCUMENTS 5,757,058 A * 5/1998 Song ........................... 257/449

6,020,643 A * 2/2000 Fukuzumi et al. .......... 257/774
6,362,012 B1 * 3/2002 Chi et al. ....................... 438/3

FOREIGN PATENT DOCUMENTS

JP 06-140737 5/1994
JP 10-303566 11/1998

* cited by examiner

*Primary Examiner*—Ori Nadav
(74) *Attorney, Agent, or Firm*—Sonnenschein Nath & Rosenthal LLP

(57) ABSTRACT

The present invention relates to a thin film circuit board device having passive elements in wiring layers. The thin film circuit board device includes a base board (2) and a circuit part (3) including insulating layers (11) and (16) and pattern wiring (14) and (17) formed on a build-up forming surface (2a). On the first insulating layer (11), a receiving electrode part (21) is formed and the passive elements electrically connected to the receiving electrode part (21) are formed. In the circuit part (3), a substrate titanium film and a substrate film are laminated so as to cover the receiving electrode part (21) and the passive elements respectively. The substrate film and the substrate titanium film in areas in which a metallic film is not formed are etched through the metallic film serving as the first pattern wiring (14) formed on the substrate film as a mask. Thus, a substrate layer (23) and a substrate titanium layer (22) are formed. Consequently, the substrate titanium film serving as the substrate titanium layer (22) prevents the corrosion of the receiving electrode part and the respective passive elements due to etching liquid to form the passive elements with high performance.

7 Claims, 34 Drawing Sheets

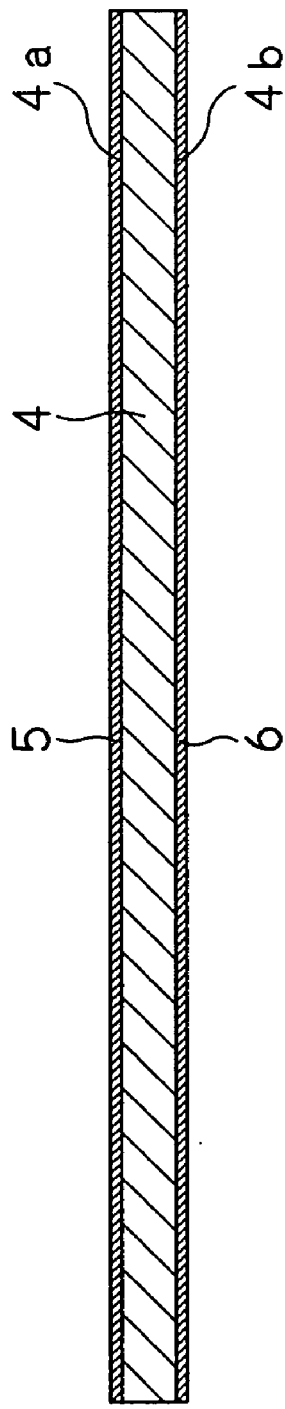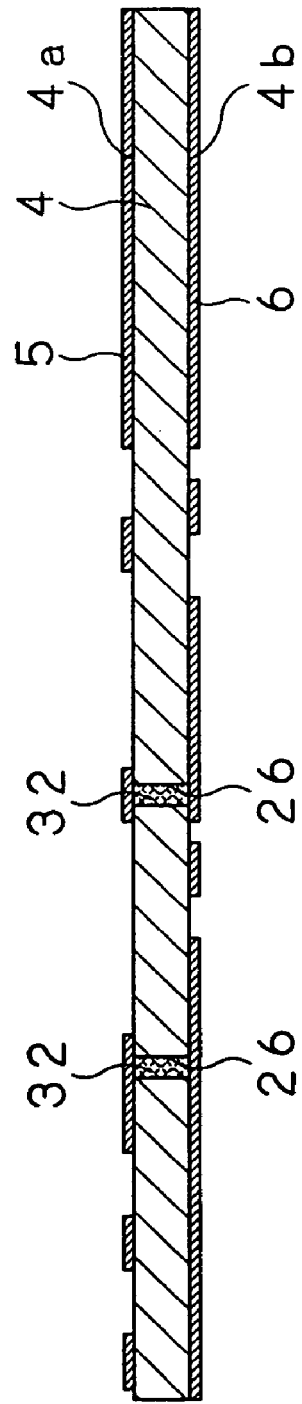

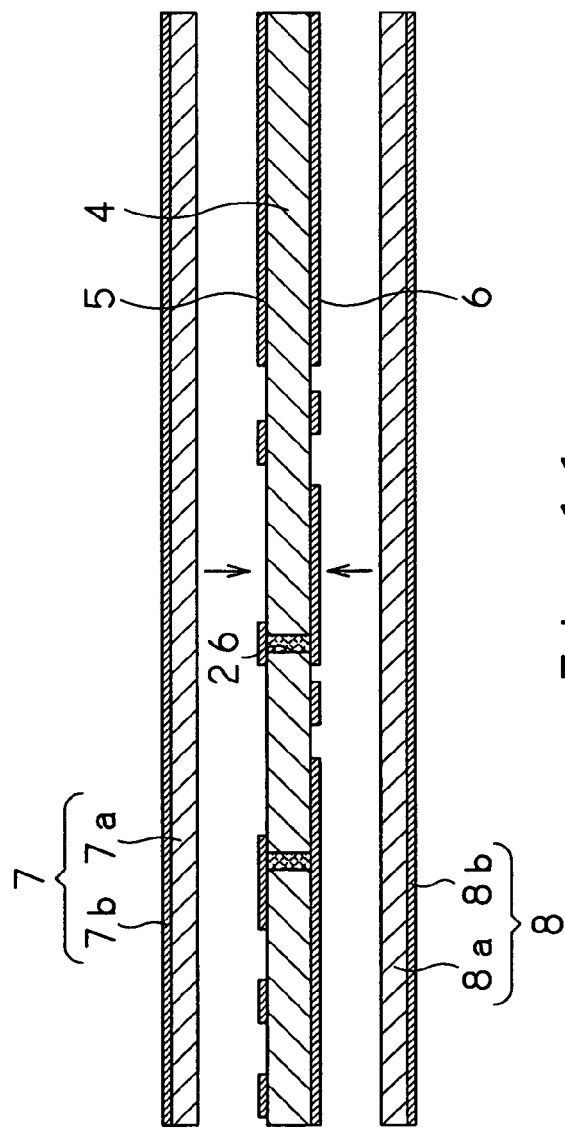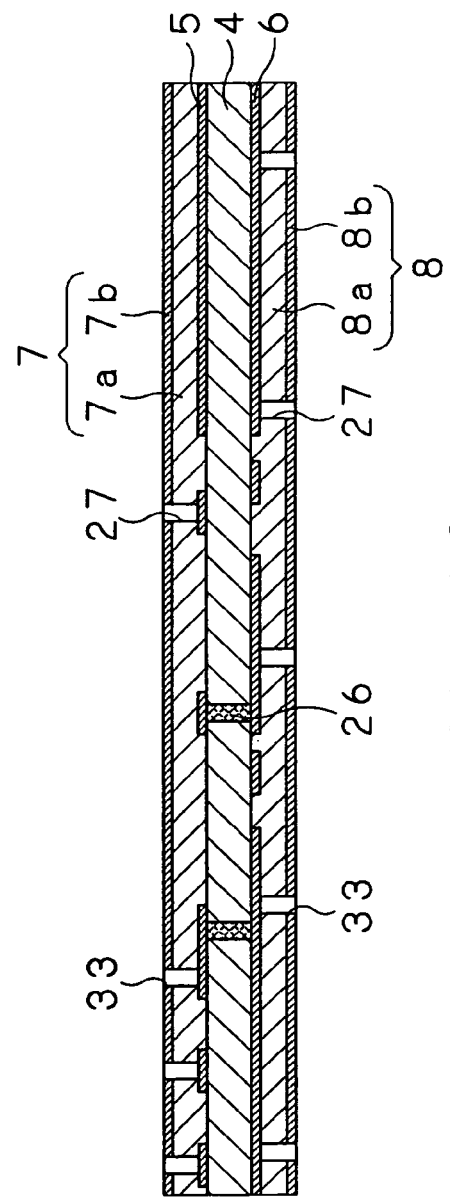

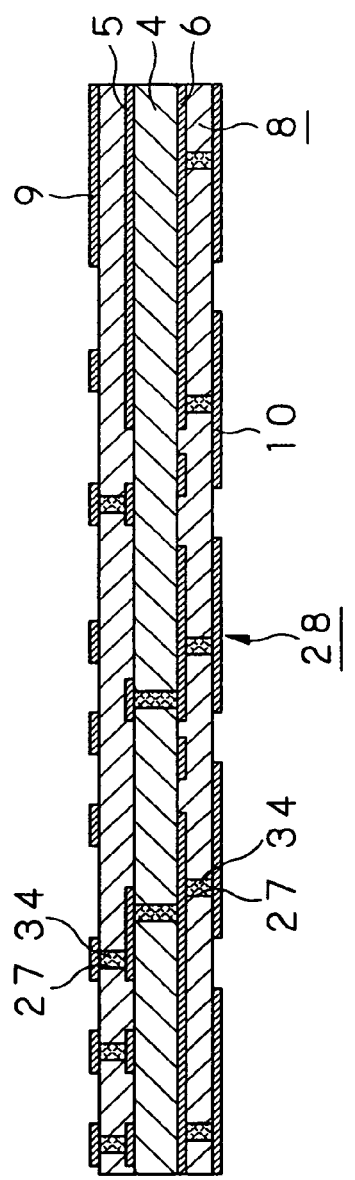
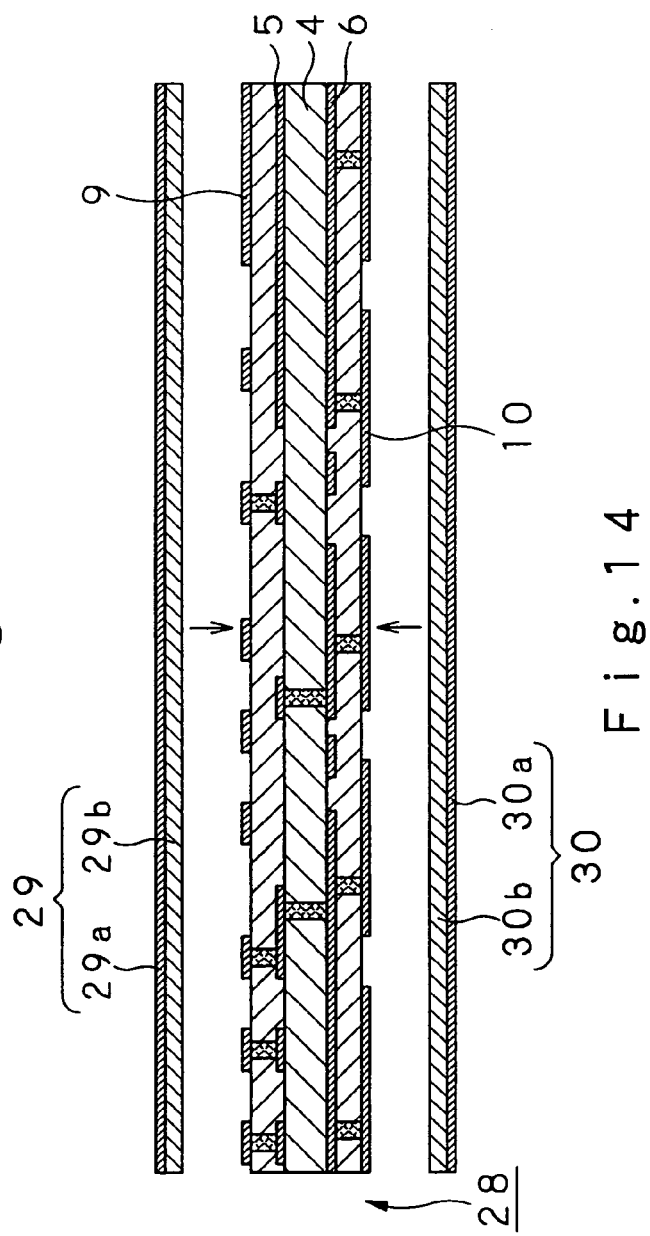

THIN FILM CIRCUIT BOARD DEVICE AND METHOD FOR MANUFACTURING THE SAME

RELATED APPLICATION DATA

The present application claims priority to Japanese Application No. P2001-289997 filed Sep. 21, 2001 and PCT/JP02/09648 filed Sep. 19, 2002 and is a divisional of U.S. Ser. No. 10/432,005 filed Sep. 22, 2003 now U.S. Pat. No. 7,199,457, all of which are incorporated herein by reference to the extent permitted by law.

TECHNICAL FIELD

The present invention relates to a thin film circuit board device having passive elements in wiring layers and a method for manufacturing the same.

BACKGROUND ART

Various kinds of information such as music, audio data, images or the like can be readily treated by compact information processors such as personal computers or mobile computers with the digitization of data. The band of these information has been compressed by an audio codec technique or an image codec technique. Thus, an environment in which the information is easily and efficiently distributed to various kinds of communication terminal equipment by a digital communication or a digital broadcasting has been arranged. For instance, audio data and video data (refer them to as AV data, hereinafter) may be received outdoors by portable telephones.

The transmitting and receiving system of data or the like has been conveniently utilized in small areas as well as in homes in various ways by forming preferable network systems. As the network systems, for instance, a narrow band radio communication system of a band of 5 GHz which is proposed in IEEE 802.11a, a radio LAN system of a band of 2.45 GHz which is proposed in IEEE 802.11b or a short-range radio communication system called a Bluetooth has been paid attention to.

In the transmitting and receiving systems for data, such wireless network systems may be effectively utilized to easily deliver various kinds of data in different places such as homes or outdoors without using repeaters, access to various types of communication networks, or transmit and receive data.

It is essentially necessary for the transmitting and receiving systems to realize compact, light and portable communication terminal equipment having the above-described communication function. The communication terminal equipment needs to modulate and demodulate an analog high frequency signal in a transmitting and receiving part. Accordingly, the communication terminal equipment generally has a high frequency transmitting and receiving circuit based on a super-heterodyne system in which a transmitted and received signal is temporarily converted into an intermediate frequency signal.

A high frequency transmitting and receiving circuit 100 comprises, as shown in FIG. 1, an antenna part 101 having an antenna or a change-over switch to receive or transmit an information signal, and a transmission and reception switching unit 102 for switching transmission and reception. The high frequency transmitting and receiving circuit 100 is provided with a receiving circuit part 105 including a frequency converting circuit part 103, a demodulating circuit part 104 or the like. Further, the high frequency transmitting and receiving circuit 100 is provided with a transmitting circuit part 109 including a power amplifier 106, a drive amplifier 107, a modulating circuit part 108 or the like. Further, the high frequency transmitting and receiving circuit 100 includes a reference frequency generating circuit part for supplying a reference frequency to the receiving circuit part 105 or the transmitting circuit part 109.

The high frequency transmitting and receiving circuit 100 having the above-described structure, the detail of which is omitted, includes large functional parts such as various filters respectively inserted between stages, VCO (voltage controlled oscillator), SAW filters (surface acoustic wave filter), etc. The high frequency transmitting and receiving circuit 100 further includes many passive parts such as inductors, resistors, capacitors characteristic of high frequency analog circuits such as matching circuits or bias circuits. Therefore, the high frequency transmitting and receiving circuit 100 becomes large as a whole, so that the communication terminal equipment using this circuit 100 hardly becomes compact and light.

In the communication terminal equipment, as shown in FIG. 2, a high frequency transmitting and receiving circuit 110 based on a direct conversion system is used in which an information signal is transmitted and received without converting the information signal into an intermediate frequency. In the high frequency transmitting and receiving circuit 110, the information signal received by an antenna part 111 is supplied to a demodulating circuit part 113 through a transmission and reception switching unit 112 and a base-band process is directly carried out. In the high frequency transmitting and receiving circuit 110, the information signal generated in a source is not converted into an intermediate frequency in a modulating circuit part 114 and directly modulated into a prescribed frequency band. The modulated signal is transmitted from the antenna part 111 through an amplifier 115 and the transmission and reception switching unit 112.

The above-described high frequency transmitting and receiving circuit 110 does not convert the information signal into the intermediate frequency and carries out a direct detection to transmit and receive the information signal. Therefore, the number of parts such as filters is reduced and an entire construction is simplified and a configuration substantially composed of one chip may be realized. However, the high frequency transmitting and receiving circuit 110 needs a filter or a matching circuit disposed in a post-stage. Since the high frequency transmitting and receiving circuit 110 carries out an amplifying operation once in a high frequency stage, the circuit 100 hardly obtains an adequate gain. A base-band part also needs to carry out an amplifying operation. Accordingly, the high frequency transmitting and receiving circuit 110 needs a cancellation circuit with DC offset or an excess low-pass filter, so that entirely consumed power is increased.

The conventional high frequency transmitting and receiving circuits of both the super-heterodyne system and the direct conversion system, as mentioned above, cannot obtain adequate characteristics as the transmitting and receiving circuits, in addition to the miniaturization and light-weight of the communication terminal equipment. Therefore, in the high frequency transmitting and receiving circuit, various attempts for modularizing, for instance, an Si-CMOS circuit as a base to be compact with a simple structure have been carried out. That is, as one of them, there exists a method for manufacturing what is called, a one-chip circuit board device. In this method, for instance, passive elements having good characteristics are formed on an Si substrate and a filter circuit or a resonator or the like are formed on an LSI, and further, the logic LSI of the base-band part is integrated.

It is important for the above-described one-chip circuit board device how to form the passive elements having good performance on the LSI. In an inductor 120 shown in FIGS. 3A and 3B, a large recessed part 124 corresponding to an Si substrate 121 and an inductor forming part 123 of an $SiO_2$ insulating layer 122 is formed. The inductor 120 is provided with a coil part 127 so as to close the opening part of the recessed part 124. The coil part 127 is connected to a first wiring layer 125 so as to protrude into the recessed part 124 and connected to a second wiring layer 126 extended on the insulating layer 122. In the inductor 120 constructed as described above, a forming step is complicated, so that the forming steps are increased to increase a manufacture cost.

In the conventional circuit board device, the electrical interference of the Si substrate provided between a circuit part of an analog circuit and a base-band circuit part of a digital circuit constitutes a serious problem.

As circuit board devices that overcome the above-described problems, for instance, a circuit board device 130 using an Si substrate as a base substrate as shown in FIG. 4 has been proposed. Further, a circuit board device 140 using a glass substrate as a base substrate as shown in FIG. 5 has been proposed.

In the circuit board device 130 shown in FIG. 4, after an $SiO_2$ layer 132 is formed on an Si substrate 131, a circuit part 133 is formed by a lithography technique. In the circuit part 133, the detail of which is omitted, passive elements 136 such as, for instance, inductors, resistors, capacitors, etc. are formed on a lower electrode 135 together with a pattern wiring 134 in multi-layers by a thin film forming technique or a thick film forming technique. The lower electrode 135 functions as a contact terminal so that these passive elements 136 are electrically connected to the pattern wiring 134.

In the circuit board device 130, terminal parts connected to the inner pattern wiring 134 through vias as through holes for relay are formed on the circuit part 133. Circuit elements 137 such as a high frequency IC, an LSI, etc. are directly mounted on these terminal parts by a flip chip mounting method. The circuit board device 130 is mounted on, for instance, a mother board, so that a circuit part and a base-band circuit part can be divided to suppress the electrical interference of both the circuit parts.

In the circuit board device 130 shown in FIG. 4, the Si substrate 131 having an electric conductivity functions upon forming respectively the passive elements in the circuit part 133. However, this substrate undesirably constitutes a factor of interference upon realizing the good high frequency characteristics of the respective passive elements.

On the other hand, the circuit board device 140 shown in FIG. 5 uses a glass substrate 141 as a base substrate in order to solve the problems of the Si substrate 131 forming the circuit board device 130 shown in FIG. 4. In the circuit board device 140, a circuit part 142 is formed on the glass substrate 141 by the lithography technique. In the circuit part 142, the detail of which is omitted, a lower electrode 144, and passive elements 145, for instance, inductors, resistors, capacitors, etc. are formed together with a pattern wiring 143 in multi-layers by the thin film forming technique or the thick film forming technique.

In the circuit board device 140 shown in FIG. 5, terminal parts connected to the inner pattern wiring through vias or the like are formed on the circuit part 142. Circuit elements 146 such as a high frequency IC, LSI, etc. are directly mounted on these terminal parts by a flip chip mounting method. In this circuit board device 140, the glass substrate 141 having no electric conductivity is used to suppress a capacity coupling between the glass substrate 141 and the circuit part 142. Thus, the passive elements having good high frequency characteristics can be formed in the circuit part 142.

In the above-described circuit board devices 130 and 140, a pattern of a high frequency signal system is formed through a wiring layer formed on the above-described Si substrate 131 or the glass substrate 141. Further, a supply wiring for a power source or a ground, a signal wiring for a control system, etc. are formed through the wiring layer. Therefore, in these circuit board devices 130 and 140, an electrical interference is generated respectively between the wiring. Further, since the wiring layers are formed in multi-layers, a manufacture cost is increased. The wiring patterns are pulled around to cause the devices themselves to be enlarged.

In the circuit board device 130, a package 150 is formed to be mounted on an interposer board 151 as shown in FIG. 6. The package 150 serves to mount the circuit board device 130 on one surface of the interposer board 151 and is entirely encapsulated with an insulating resin 152. In the package 150, pattern wiring 153 or input and output terminal parts 154 are respectively formed on both the front and back surfaces of the interposer board 151. Further, many electrode parts 155 are formed in the periphery of an area on which the circuit board device 130 is mounted.

In the package 150, while the circuit board device 130 is mounted on the interposer board 151, the circuit board device 130 is electrically connected to the electrode parts 155 by wires 156 in accordance with a wire bonding method. Thus, power can be supplied from an external power source to transmit a signal to and receive a signal from an external circuit. Consequently, in the circuit board device 130 shown in FIG. 4, electrodes 138 to which the pattern wiring 134 or the wires 156 are connected are formed on a surface layer on which the circuit elements 137 such as the high frequency IC, LSI, etc. are mounted. The circuit board device 140 shown in FIG. 5 is packaged in the same manner as described above.

These circuit board devices 130 and 140 are mounted on the interposer board 151 and packaged as mentioned above, however, the thickness or the area of the package 150 is inconveniently increased. Both the circuit board devices 130 and 140 increase the cost of the package 150.

A shield cover 157 with which the circuit elements 137 such as the high frequency IC, LSI, etc. mounted on the circuit board devices 130 and 140 are covered to reduce the influence of electromagnetic wave noise is attached to the package 150. Therefore, in the package 150, heat generated from the circuit elements 137 or the like is stored in the shield cover 157 to deteriorate characteristics as the transmitting and receiving circuit, so that a heat radiating mechanism needs to be provided.

In such a package 150, since the Si substrate 131 or the glass substrate 141 is used in the circuit board devices 130 and 140, it is difficult to provide heat radiating mechanisms for radiating heat from the substrate sides to cause the devices themselves to be enlarged.

Since the relatively expensive Si substrate 131 or the glass substrate 141 is used as the base substrate to increase the cost of the circuit board devices 130 and 140, the circuit board devices 130 and 140 are hardly provided at low cost.

In the circuit board devices 130 and 140, the pattern wiring 134 and 143 are patterned and formed in the circuit parts 133 and 142. In this case, there is a fear that, for instance, etching liquid used in an etching process may possibly corrode the lower electrodes 135 and 144 or the passive elements 136 and 145 or the like. Accordingly, in the circuit board devices 130 and 140, there is also a fear that the passive elements 136 and 145 may be possibly deteriorated, or an inconvenience may be possibly generated in an electric contact between the passive elements 136 and 145 and the pattern wiring 134 and 143.

DISCLOSURE OF THE INVENTION

It is an object of the present invention to provide a new thin film circuit board device capable of solving the problems of the above-described conventional circuit board device and a method for manufacturing it.

It is another object of the present invention to provide a thin film circuit board device in which passive elements of high performance are formed on a base board and a thin and compact form can be realized and a method for manufacturing it.

It is a still another object of the present invention to provide a thin film circuit board device that can be manufactured at low cost by suppressing the increase of a manufacture cost and a method for manufacturing it.

A thin film circuit board device according to the present invention proposed to achieve the above-described objects comprises: a base board having a flattened main surface as a build-up forming surface; and a circuit part including insulating layers and wiring layers built up and formed on the build-up forming surface of the base board, a receiving electrode part having a titanium layer and an electrode layer sequentially laminated on the insulating layer and at least a capacitor part and/or resistor part as a passive element part electrically connected to the receiving electrode part. The circuit part has a substrate titanium film and a substrate film sequentially laminated on the insulating layer so as to cover the receiving electrode part and the passive element part. The circuit part further has a substrate layer on which a pattern is formed by applying a first wet type etching process to the substrate film in an area in which a metallic film is not formed through the metallic film serving as the wiring layer in which a pattern is formed on the substrate film as a shield part. The circuit part further has a substrate titanium layer on which a pattern is formed by applying a second wet type etching process to the substrate titanium film in the area in which the metallic film is not formed.

In the thin film circuit board device according to the present invention, the wet type etching processes are respectively applied to the substrate titanium film and the substrate film for covering the receiving electrode part and the passive element part formed on the insulating layer in the circuit part. Thus, the substrate titanium layer and the substrate layer are sequentially laminated as the substrates of the wiring layers. Thus, in the thin film circuit board device, the substrate titanium layer serves to improve an adhesion between the insulating layer, the receiving electrode part and the passive element part, and the substrate layer. Further, the substrate titanium film serving as the substrate titanium layer functions as a protective film for preventing the receiving electrode part and the passive element part from corroding by etching liquid when the wet type etching process is applied to the substrate film. Therefore, the passive elements of high performance are formed in the circuit part.

A method for manufacturing a thin film circuit board device according to the present invention proposed to achieve the above-described objects comprises: a base board forming step of forming a base board which has a flattened main surface as a build-up forming surface; and a circuit part forming step of building up and forming a circuit part which includes insulating layers and wiring layers laminated on the build-up forming surface of the base board, a receiving electrode part having a titanium layer and an electrode layer sequentially laminated on the insulating layer, and at least a capacitor part and/or resistor part as a passive element part electrically connected to the receiving electrode part. The circuit part forming step has a film forming step of forming a substrate titanium film and a substrate film sequentially formed on the insulating layer so as to cover the receiving electrode part and the passive element part, a metallic film forming step of patterning and forming a metallic film on the substrate film as the wiring layer, a step of a first wet type etching process in which a wet type etching process is applied to the substrate film in an area in which the metallic film is not formed through the metallic film as a shield part to pattern and form a substrate layer, and a step of a second wet etching process in which a wet type etching process is applied to the substrate titanium film in the area in which the metallic film is not formed to form and pattern a substrate titanium layer.

In the method for manufacturing a thin film circuit board device according to the present invention, the substrate titanium film serving as the substrate titanium layer for covering the receiving electrode part and the passive element part is formed on the insulating layer. Thus, the substrate titanium layer improves an adhesion between the insulating layer, the receiving electrode part and the passive element part, and the substrate layer. Further, the substrate titanium film serving as the substrate titanium layer prevents the corrosion of the receiving electrode part and the passive element part due to the etching liquid when the substrate layer is patterned and formed by the wet type etching process. Therefore, the thin film circuit board device having the passive elements of high performance in the circuit part can be manufactured.

Still other objects of the present invention and specific advantages obtained by the present invention will be more apparent from the description of embodiments made by referring to the drawings.

BRIEF DESCRIPTION OF THE DRAWINGS

FIG. 9 is a view for explaining the manufacturing steps of the thin film circuit board device and shows a longitudinally sectional view of a core board.

FIG. 10 is a view for explaining the manufacturing steps of the thin film circuit board device and shows a longitudinally sectional view of a core board on which first and second wiring layers are formed.

FIG. 11 is a longitudinally sectional view for explaining the manufacturing steps of the thin film circuit board device in which first and second resin coated copper foils are bonded together.

FIG. 12 is a longitudinally sectional view for explaining the manufacturing steps of the thin film circuit board device in which vias are formed in the first and second resin coated copper foils.

FIG. 13 is a longitudinally sectional view for explaining the manufacturing steps of the thin film circuit board device showing the intermediate body of a base board.

FIG. 14 is a longitudinally sectional view for explaining the manufacturing steps of the thin film circuit board device in which third and fourth resin coated copper foils are bonded together.

FIG. 50A is a longitudinally sectional view of a double-sided board, FIG. 50B is a longitudinally sectional view showing that pattern wiring is patterned and formed, FIG. 50C is a longitudinally sectional view showing a state that the double-sided boards are bonded together, FIG. 50D is a longitudinally sectional view showing an intermediate body of the base board, FIG. 50E is a longitudinally sectional view showing a state that resin coated copper foils are respectively bonded to main front and back surfaces of the intermediate body of the base board, and FIG. 50F is a longitudinally sectional view showing a completed base board.

FIG. 51A is a longitudinally sectional view showing an intermediate body of the base board, FIG. 51B is a view showing a state that the intermediate bodies of the base board is coated with a liquid resin material by the dip coat method, FIG. 51C is a longitudinally sectional view showing a state that resin layers are respectively formed on main front and back surfaces of the intermediate body of the base board, and FIG. 51D is a longitudinally sectional view showing a completed base board.

BEST MODE FOR CARRYING OUT THE INVENTION

Figure 1:
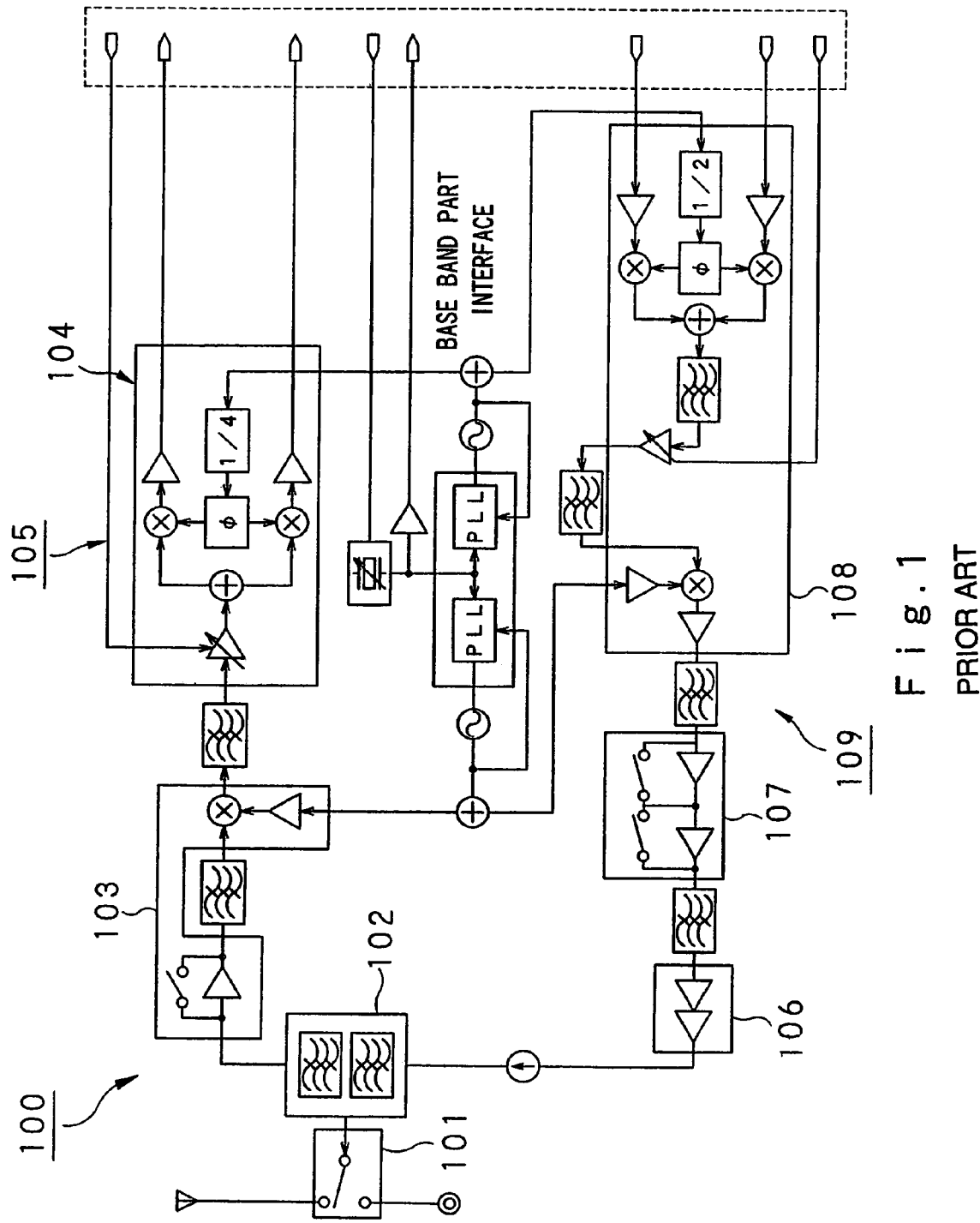
FIG. 1 is a block diagram showing a high frequency transmitting and receiving circuit using a super-heterodyne system.
Figure 2:
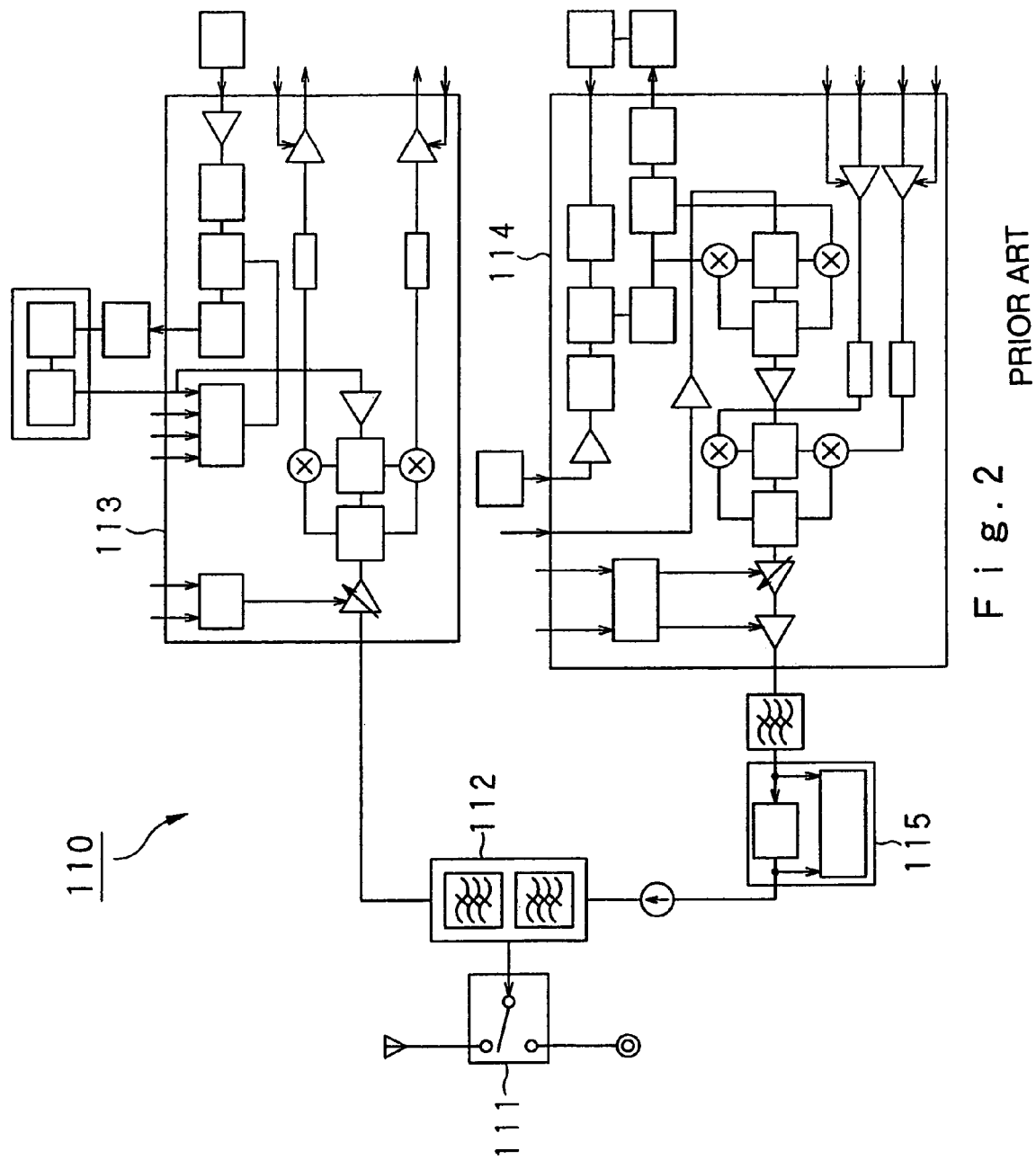
FIG. 2 is a block diagram showing a high frequency transmitting and receiving circuit using a direct conversion system.
Figure 3A:
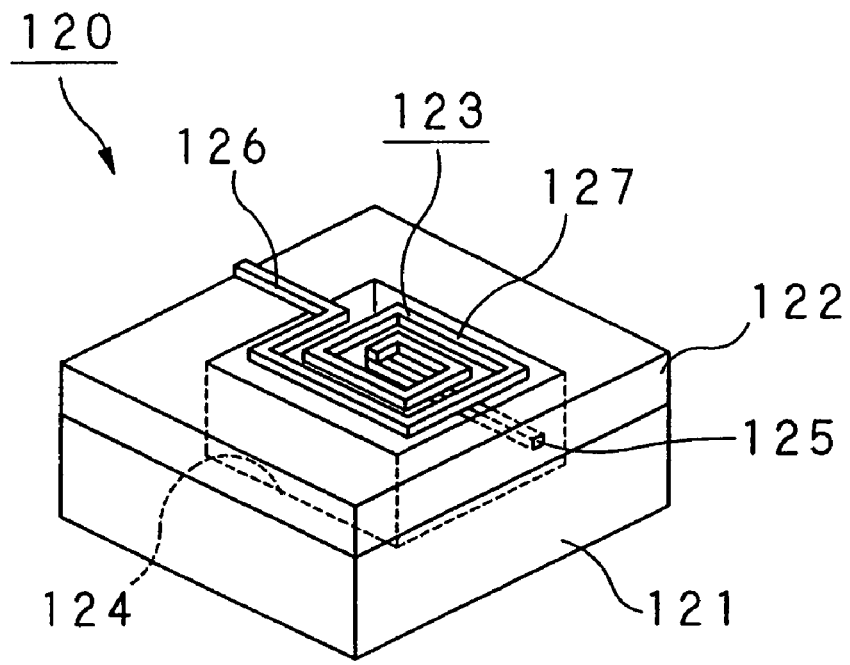
FIG. 3A is a perspective view showing an inductor provided in a conventional high frequency module board device and FIG. 3B is a longitudinally sectional view thereof.
Figure 3B:
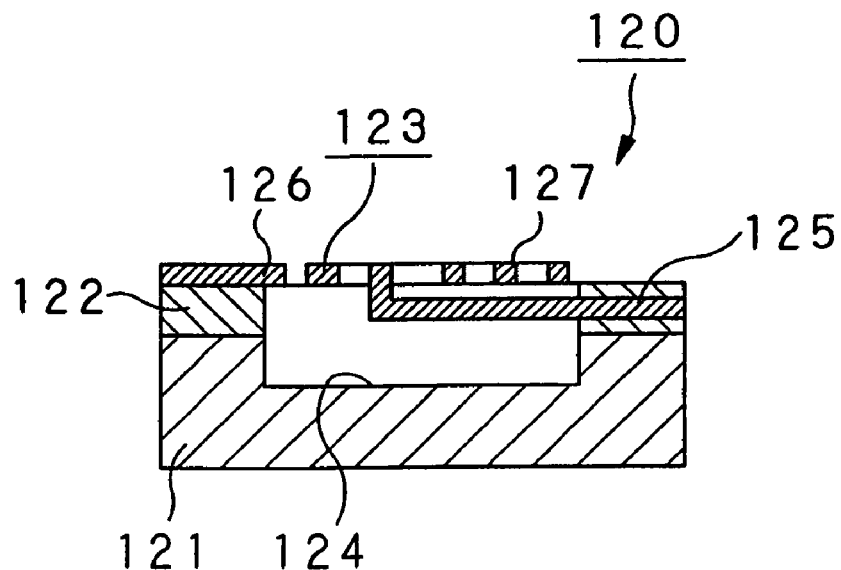
Figure 4:
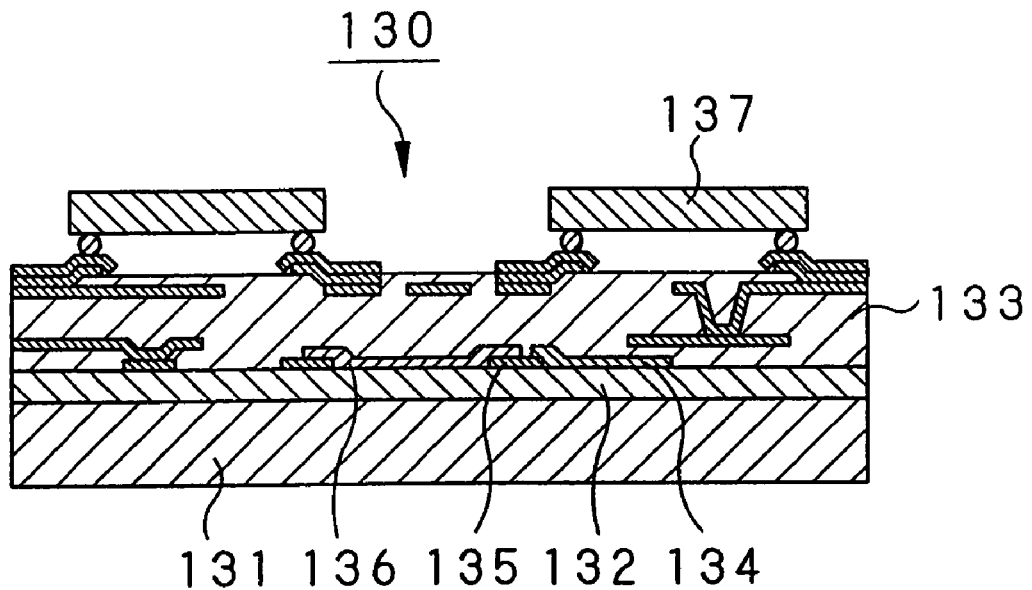
FIG. 4 is a longitudinally sectional view showing a structure that uses a silicon substrate for a base board of a high frequency module board device.
Figure 5:
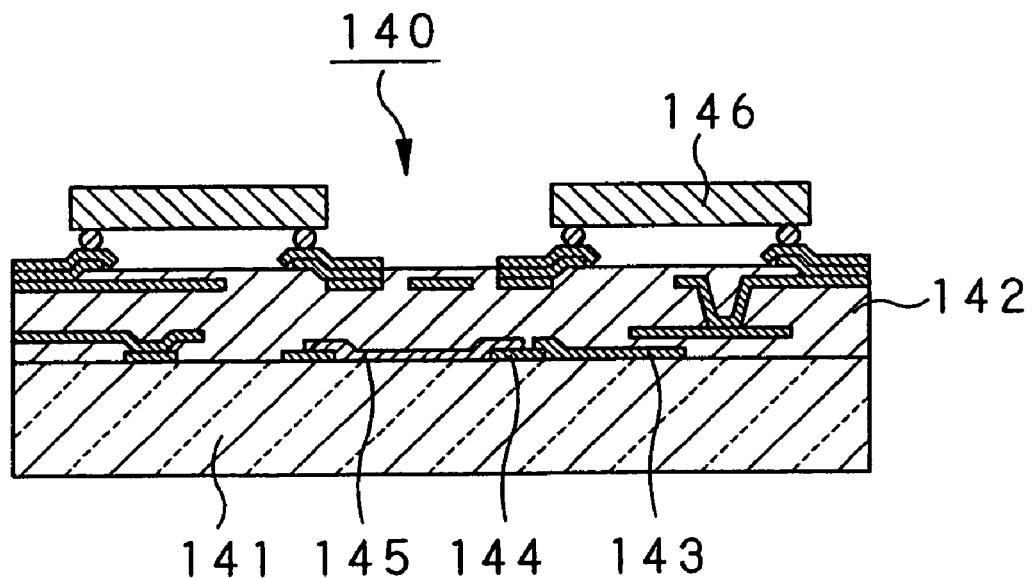
FIG. 5 is a longitudinally sectional view showing a structure that uses a glass substrate for a base board of a high frequency module board device.
Figure 6:
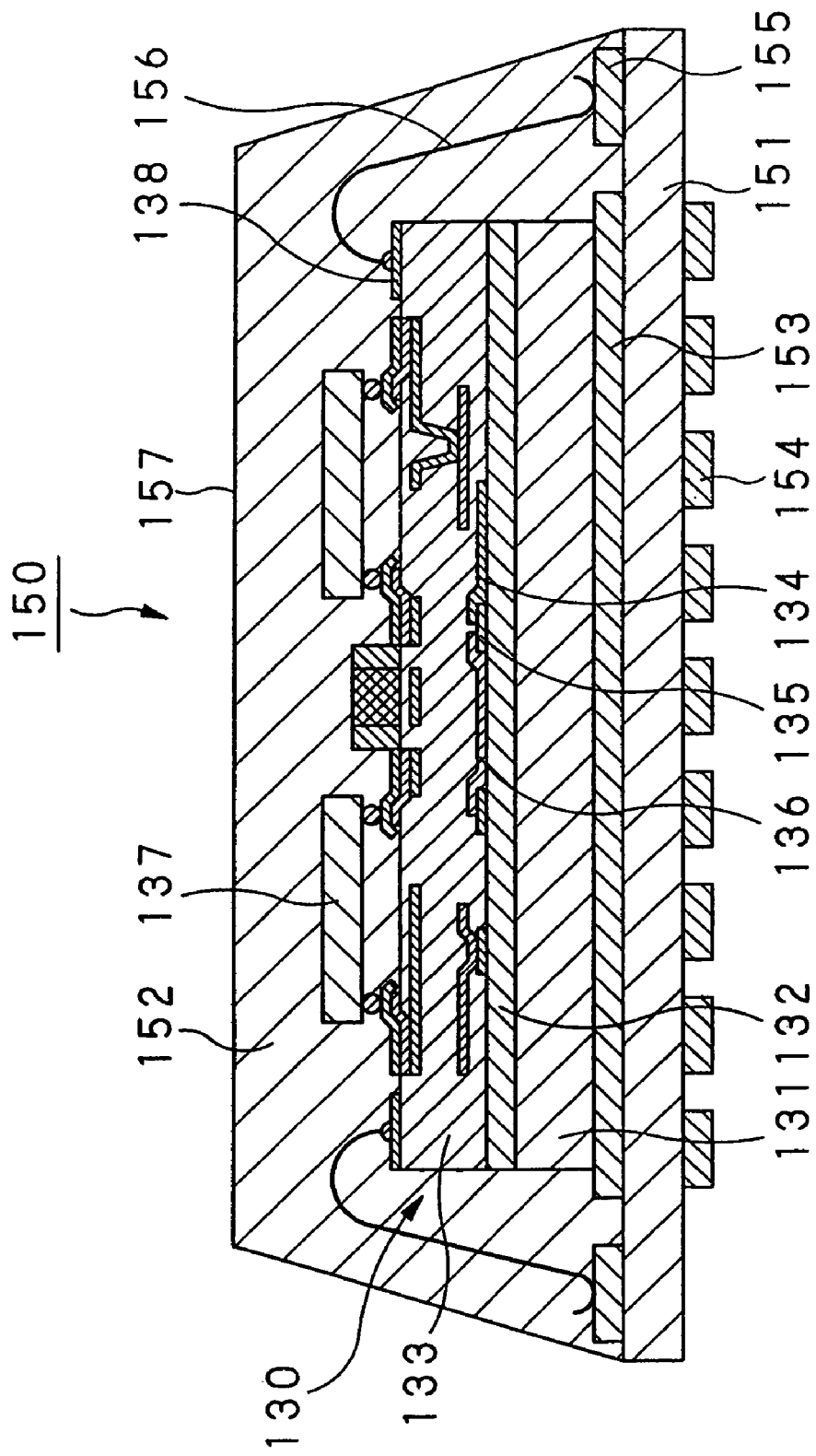
FIG. 6 is a longitudinally sectional view showing a package in which the high frequency module board device is mounted on an interposer board.

Now, embodiments of a thin film circuit board device and a method for manufacturing it according to the present invention will be described below by referring to the drawings.

Figure 7:
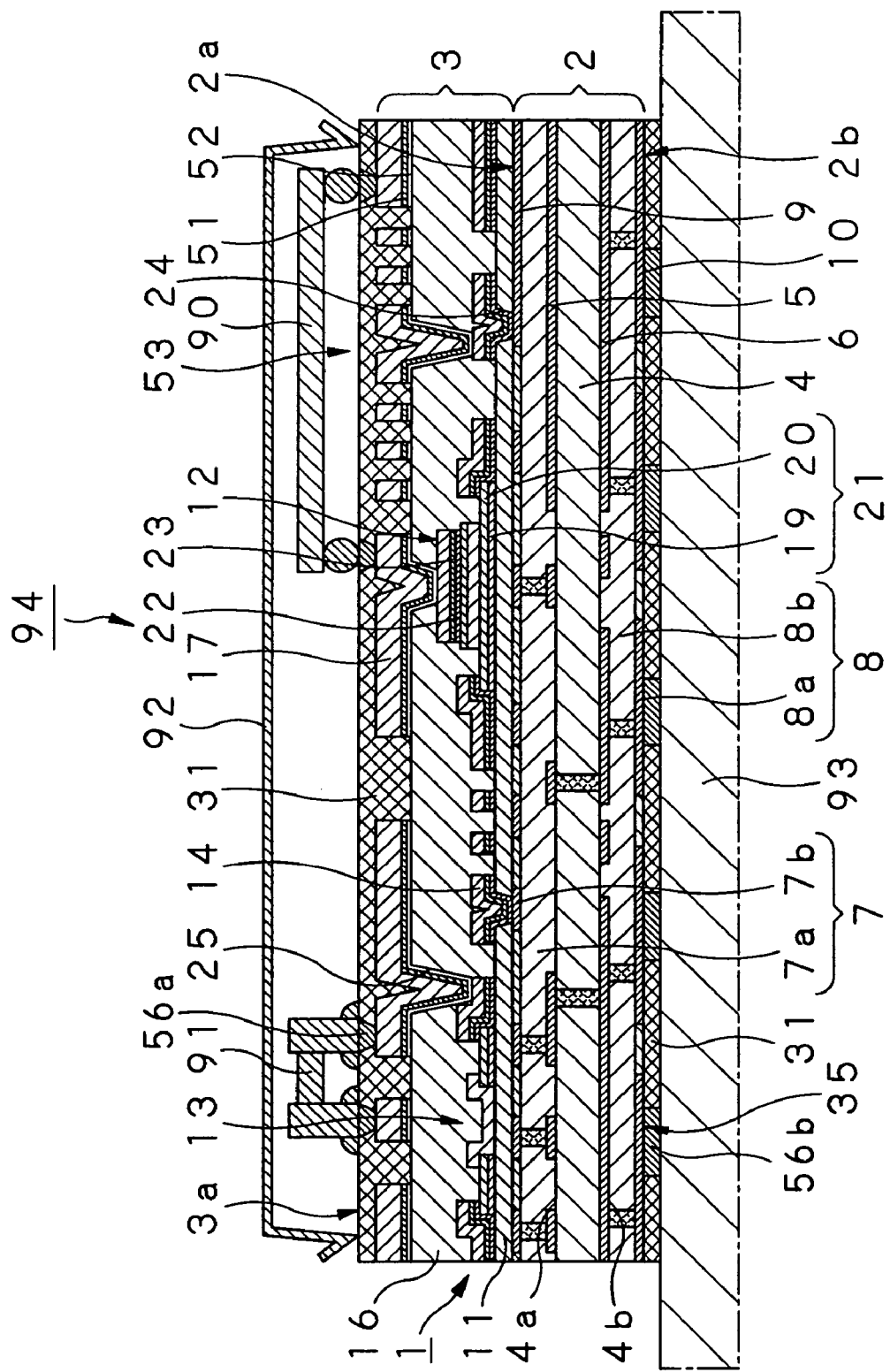
FIG. 7 is a main part longitudinally sectional view of a high frequency module device on which a thin film circuit board device according to the present invention is mounted.

A thin film circuit board device (abbreviate it as a circuit board, hereinafter) according to the present invention has a structure as shown in FIG. 7. The circuit board 1 shown in FIG. 7 comprises a base board 2 the uppermost layer of which is formed in a highly accurate flat surface as a build-up forming surface 2a and a circuit part 3 built up and formed thereon. Further, on the circuit part 3, passive elements or the like are formed as high frequency functional elements to form a high frequency circuit board device.

In the circuit board 1, the base board 2 forms a wiring part for a power source system or a control system relative to the circuit part 3 formed on the build-up forming surface 2a or a mounting surface 3a relative to a mother board 93. As shown in FIG. 7, in the circuit board 1, a high frequency IC 90 or chip parts 91 are mounted on the surface of the circuit part 3 as the mounting surface 3a. Further, a shield cover 92 is attached to the circuit board 1 and the surface thereof is entirely encapsulated with an encapsulating material such as a synthetic resin. In the circuit board 1, the main surface opposite to the build-up forming surface 2a of the base board 2 serves as a mother board mounting surface 2b. The circuit board 1 is mounted on the mother board 93 as what is called a one-chip parts so that the mother board mounting surface 2b is opposed to the mother board 93. The circuit board 1 is preferably employed for portable devices to form a high frequency module device 94 having a radio transmitting and receiving function.

The base board 2 has a core board 4 made of a double-sided board, a first wiring layer 5 formed in a first main surface 4a side through the core board 4 as a core, and a second wiring layer 6 formed in a second main surface 4b side. In the base board 2, a first resin coated copper foil 7 is bonded to the first main surface 4a side of the core board 4 and a second resin coated copper foil 8 is bonded to the second main surface 4b side of the core board 4.

The core board 4 is formed of a material having low dielectric constant and low Tan δ, that is, a material excellent in its high frequency characteristics, such as polyphenylene ether (PPE), bismaleimide triazine (BT-resin), polytetrafluoro ethylene, polyimide, liquid crystal polymer (LCP), polynorbornene (PNB), ceramic or a mixture of ceramic and an organic material, etc. For the core board 4, for instance, an epoxy copper clad board FR-5 high in its mechanical strength, excellent in its heat resistance and chemical resistance and more inexpensive than a base material made of the above-described materials may be used.

The first and second wiring layers 5 and 6 are made of metal such as Cu high in its electric conductivity and respectively formed on both the main surfaces of the core board 4 by a plating method or the like.

The first resin coated copper foil 7 includes a resin layer 7a and a copper layer 7b and is bonded to the first main surface 4a of the core board 4 so that the main surface of the resin layer 7a is opposed to the first main surface 4a. The copper layer 7b of the first resin coated copper foil 7 is patterned by, for instance, etching to form a third wiring layer 9.

The second resin coated copper foil 8 includes a resin layer 8a and a copper layer 8b and is bonded to the second main surface 4b of the core board 4 so that the main surface of the resin layer 8a is opposed to the second main surface 4b. The copper layer 8b of the second resin coated copper foil 8 is patterned by, for instance, etching to form a fourth wiring layer 10.

In the base board 2, an uppermost layer of the first main surface 4a side of the core board 4 is ground until the third wiring layer 9 is exposed. Thus, the highly accurately flattened build-up forming surface 2a is formed.

The circuit part 3 comprises a high frequency layer 15 in which a first insulating layer 11 and a first pattern wiring 14 including at least capacitor 12, a resistor 13, etc. as passive elements are sequentially laminated on the build-up forming surface 2a of the highly accurately flattened base board 2, and a second high frequency layer 18 in which a second insulating layer 16 and a second pattern wiring 17 are sequentially laminated on the first high frequency layer 15.

In the circuit part 3, the first insulating layer 11 and the second insulating layer 16 are formed of an organic material excellent in its high frequency characteristics like the above-described core board 4. The first pattern wiring 14 and the second pattern wiring 17 are patterned and formed by patterning copper foils formed under, for instance, a plating work or the like by etching. In the circuit part 3, the passive elements are respectively electrically connected to a receiving electrode part 21 in which a lower titanium layer 19 and an electrode layer 20 are sequentially laminated. Substrate titanium layers 22 and 52 and substrate layers 23 and 51 as the substrates of the pattern wiring 14 and 17 are sequentially laminated and respectively electrically connected to the receiving electrode part 21.

In the high frequency layer 15 of the circuit part 3, vias 24 through which the base board 2 is electrically connected to the first pattern wiring 14 are provided in the first insulating layer 11. In the second high frequency layer 18, vias 25 through which the first pattern wiring 14 is electrically connected to the second pattern wiring 17 are provided in the second insulating layer 16.

Now, referring to FIGS. 8 to 45, a method for manufacturing the circuit board 1 constructed as mentioned above will be described.

Figure 8:
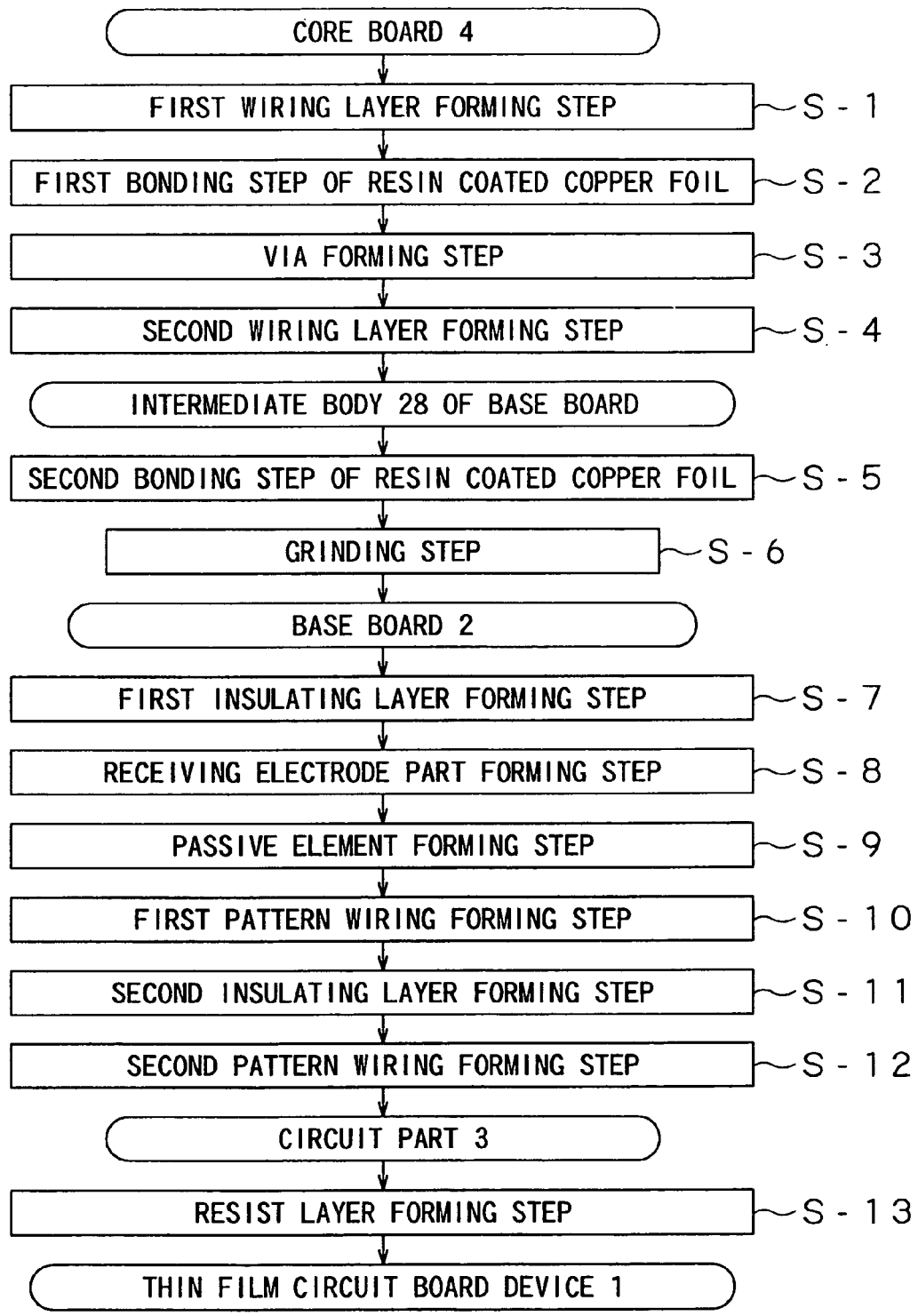
FIG. 8 is a flowchart showing the manufacturing steps of the thin film circuit board device in order of manufacturing steps.

The manufacturing steps of the circuit board 1 include, as shown in FIG. 8, a first wiring layer forming step S-1. In the first wiring layer forming step S-1, the suitable first wiring layer 5 and the second wiring layer 6 are formed on both the main surfaces 4a and 4b of the front and back sides of the core board 4 and a plurality of vias 26 passing through the core board 4 are formed. The manufacturing steps further include a first bonding step S-2 of resin coated copper foils in which the first resin coated copper foil 7 and the second resin coated copper foil 8 are respectively bonded to the front and back main surfaces 4a and 4b of the core board 4. The manufacturing steps further include a via forming step S-3 in which vias 27 are formed in a pair of resin coated copper foils 7 and 8. In the manufacturing steps of the circuit board 1, a base board intermediate body (refer it to as an intermediate body, hereinafter) 28 is formed through a second wiring layer forming step S-4. In the second wiring layer forming step S-4, the copper layers 7b and 8b of one pair of bonded resin coated copper foils 7 and 8 are patterned to respectively pattern and form the suitable third wiring layer 9 and the fourth wiring layer 10.

In the manufacturing steps of the circuit board 1, the base board 2 is formed through a second bonding step S-5 of resin coated copper foils and a grinding step S-6. In the second bonding step S-5 of resin coated copper foils, a third resin coated copper foil 29 and a fourth resin coated copper foil 30 are respectively bonded so as to cover the third wiring layer 9 and the fourth wiring layer 10 formed on both the main surfaces of the intermediate body 28. In the grinding step S-6, the third resin coated copper foil 29 and the fourth resin coated copper foil 30 are ground to form the highly accurately flattened build-up forming surface 2a in the uppermost layer of the first main surface 4a side.

The manufacturing steps of the circuit board 1 include a first insulating layer forming step S-7, a receiving electrode part forming step S-8 and a first passive element forming step S-9. In the first insulating layer forming step S-7, a first insulating layer 11 is formed on the build-up forming surface 2a of the base board 2 obtained in such a manner. In the receiving electrode part forming step S-8, a receiving electrode part 21 in which a lower titanium layer 19 and an electrode layer 20 are sequentially laminated on the insulating layer 11 is formed. In the first passive element forming step S-9, the passive elements such as the capacitor 12, the resistor 13, etc. of a passive element part electrically connected to the receiving electrode part 21 are formed.

In the manufacturing steps of the circuit board 1, the circuit part 3 is formed through a first pattern wiring forming step S-10, a second insulating layer forming step S-11 and a second pattern wiring forming step S-12. In the first pattern wiring forming step S-10, the first pattern wiring 14 electrically connected to the receiving electrode part 21 formed on the first insulating layer 11 is patterned and formed. In the second insulating layer forming step S-11, the second insulating layer 16 for respectively covering the first pattern wiring 14 and the passive elements is formed. In the second pattern wiring forming step S-12, the second pattern wiring 17 having the passive elements such as an inductor or the like on the second insulating layer 16 is patterned and formed. In the manufacturing steps of the circuit board 1, the circuit board 1 is manufactured through a resist layer forming step S-13 in which resist layers 31 for covering main front and back surfaces are formed.

When the circuit board 1 is manufactured through the above-described steps, the core board 4 serving as a core of the base board 2 is firstly prepared as shown in FIG. 9. On the core board 4, the copper foil layers serving as the first wiring layer 5 and the second wiring layer 6 are formed over the entire surfaces of the first main surface 4a and the second main surface 4b.

The first wiring layer forming step S-1 is applied to the core board 4. Specifically, a drilling work by a drill or laser is applied to the core board 4 to form the vias 26 at prescribed positions as shown in FIG. 10. In the core board 4, a conducting process is applied to the inner walls of the vias 26 by, for instance, plating, and electrically conductive paste 32 is buried therein to form covers by plating. Further, in the core board 4, a photolithography process is applied to copper foil layers on both the surfaces so that the first wiring layer 5 and the second wiring layer 6 are patterned and formed on the first main surface 4a and the second main surface 4b.

Then, the first bonding step S-2 of the resin coated copper foils is applied to the core board 4 through the above-described step. Specifically, in the core board 4, the first resin coated copper foil 7 and the second resin coated copper foil 8 with which the first wiring layer 5 and the second wiring layer 6 are respectively covered are respectively bonded to the first main surface 4a side and the second main surface 4b side, as shown in FIG. 11. For the first resin coated copper foil 7 and the second resin coated copper foil 8, what is called resin coated copper foils in which the entire surfaces of one main surfaces of the copper layers 7b and 8b are backed with the resin layers 7a and 8a, respectively are employed.

Then, the first resin coated copper foil 7 and the second resin coated copper foil 8 are respectively bonded to the first main surface 4a side and the second main surface 4b side by an adhesive resin (prepreg). The resin layers 7a and 8a sides serve as bonding surfaces. In the first resin coated copper foil 7 and the second resin coated copper foil 8, when the resin layers 7a and 8a are made of a thermoplastic resin, the adhesive resin is not required. Thus, the resin layers 7a and 8a are respectively bonded to the core board 4.

Subsequently, the via forming step S-3 is applied to the first resin coated copper foil 7 and the second resin coated copper foil 8. In the via forming step S-3, as shown in FIG. 12, the photolithography process is applied to parts respectively corresponding to the above-described vias 26 to form the vias 27 respectively in the first resin coated copper foil 7 and the second resin coated copper foil 8. In the via forming step S-3, the photolithography process is applied to the parts in which the vias 27 are formed. Then, a wet type etching is carried out to form opening parts 33 in the first resin coated copper foil 7 and the second resin coated copper foil 8. A laser work is applied through these opening parts 33 as masks to form the vias 27 having the land parts of the first wiring layer 5 or the second wiring layer 6 as receiving parts.

Then, in the first resin coated copper foil 7 and the second resin coated copper foil 8, a conducting process is applied to the inner walls of the vias 27 by a via plating method as shown in FIG. 13. The vias 27 are filled with electrically conductive materials 34 by a plating method or burying electrically conductive paste.

Then, the second wiring layer forming step S-4 is applied to the first resin coated copper foil 7 and the second resin coated copper foil 8. In the second wiring layer forming step S-4, a prescribed patterning process is respectively applied to the copper layers 7b and 8b of the first resin coated copper foil 7 and the second resin coated copper foil 8. Thus, the third wiring layer 9 and the fourth wiring layer 10 are formed. In the second wiring layer forming step S-4, specifically, the same photolithography process as that of the above-described first wiring layer forming step S-1 is applied to the copper layers 7b and 8b. Thus, the intermediate body 28 having the third wiring layer 9 and the fourth wiring layer 10 respectively patterned on the resin layers 7a and 8a is formed.

Then, as shown in FIG. 14, the third resin coated copper foil 29 and the fourth resin coated copper foil 30 are respectively bonded to the third wiring layer 9 side and the fourth wiring layer 10 side in the intermediate body 28 by the second bonding step S-5 of the resin coated copper foils. For the third resin coated copper foil 29 and the fourth resin coated copper foil 30, what is called resin coated copper foils in which the entire parts of one main surfaces of copper layers 29a and 30a are respectively backed with resin layers 29b and 30b are used like the above-described first resin coated copper foil 7 and the second resin coated copper foil 8.

Figure 15:
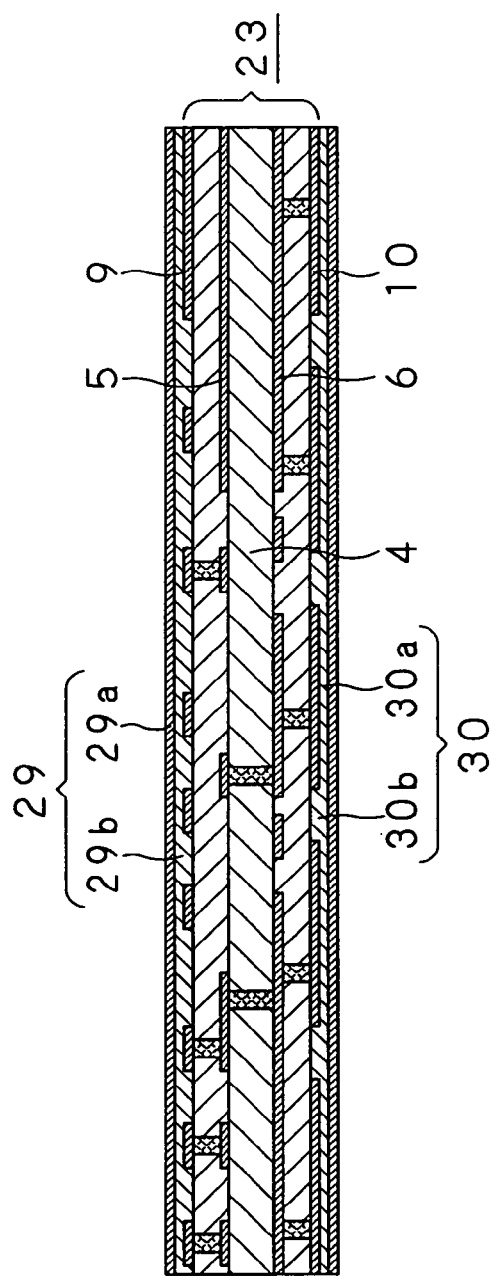
FIG. 15 is a longitudinally sectional view for explaining the manufacturing steps of the thin film circuit board device in which the third and fourth resin coated copper foils are bonded to the intermediate body of the base board.

Then, the third resin coated copper foil 29 and the fourth resin coated copper foil 30 are respectively bonded to the main front and back surfaces of the intermediate body 28 by an adhesive resin (prepreg) as shown in FIG. 15. The resin layers 29b and 30b serve as bonding surfaces. When the resin layers 29b and 30b are made of a thermoplastic resin, the adhesive resin is not required and the third resin coated copper foil 29 and the fourth resin coated copper foil 30 are bonded to the intermediate body 28.

Subsequently, a grinding process is applied to the third resin coated copper foil 29 and the fourth resin coated copper foil 30 bonded to the intermediate body 28 by the grinding step S-6. In the grinding step S-6, the third resin coated copper foil 29 and the fourth resin coated copper foil 30 are entirely ground by a grinding material composed of, mixed liquid of, for instance, alumina and silica. Thus, both the surfaces of the intermediate body 28 are formed as highly accurately flattened surfaces.

Figure 16:
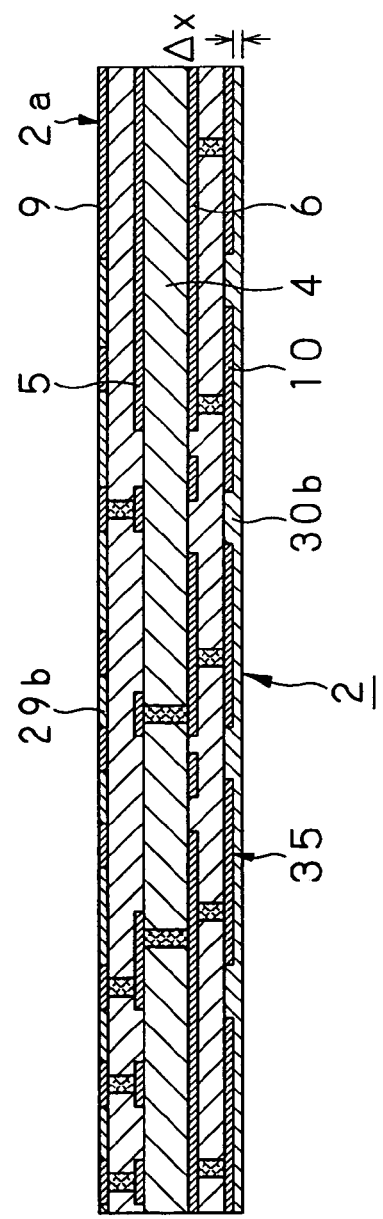
FIG. 16 is a longitudinally sectional view for explaining the manufacturing steps of the thin film circuit board device showing the base board.

In the grinding step S-6, the grinding process is applied to the third resin coated copper foil 29 side, in other words, the build-up forming surface 2a until the third wiring layer 9 is exposed, as shown in FIG. 16. In the grinding step S-6, the grinding process is applied to the fourth resin coated copper foil 30 side so that the resin layer 30b leaves a prescribed thickness Δx without exposing the fourth wiring layer 10. Thus, the base board 2 having the highly accurately flattened build-up forming surface 2a is manufactured through the above-described steps.

In the base board 2, the circuit part 3 is formed on the third wiring layer 9, so that the resin layer 29b for protecting the third wiring layer 9 from a chemical, mechanical or thermal load is not necessary. In the base board 2, the third wiring layer 9 forms a wiring part of a power supply system, or a wiring part of a control system or a ground part relative to the circuit part 3. In the base board 2, the fourth wiring layer 10 is protected from a chemical, mechanical or thermal load by the left resin layer 30b. After the circuit part 3 is formed, the above-described resin layer 30b is cut and removed. Thus, the fourth wiring layer 10 is exposed to become input and output terminal parts 35 electrically connected to the mother board 93.

The steps for manufacturing the intermediate body 28 are the same as steps for manufacturing a conventional multi-layer board, so that the process for manufacturing the multi-layer board can be directly applied to the base board 2 manufactured by the above-described steps. Further, the base board has characteristics excellent in mass-production. The steps for manufacturing the base board 2 are not limited to the above-described steps and the conventionally employed steps for manufacturing various kinds of multi-layer boards may be used.

Figure 17:
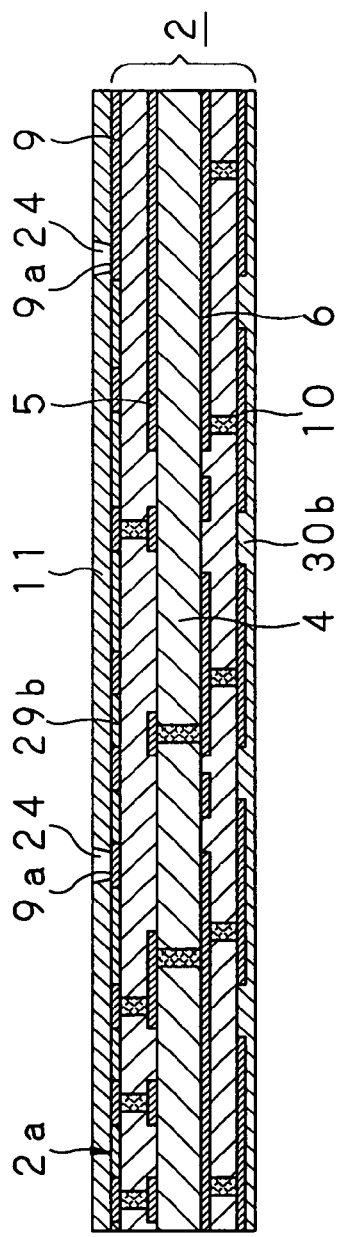
FIG. 17 is a longitudinally sectional view for explaining the manufacturing steps of the thin film circuit board device in which a first insulating layer is formed on the build-up forming surface of the base board.

Then, in the base board 2, the first insulating layer forming step S-7 is carried out to the build-up forming surface 2a as shown in FIG. 17. Thus, an insulating dielectric material is supplied to the build-up forming surface 2a to form the insulating layer 11. As the insulating dielectric material forming the first insulating layer 11, a material similar to that of the core board 4 is used which has a low dielectric constant and low Tan δ, that is, a material excellent in its high frequency characteristics and excellent in its heat resistance or chemical resistance. Specifically, as the insulating dielectric materials, for instance, benzocyclobutene (BCB), polyimide, polynorbornene (PNB), liquid crystal polymer (LCP), or epoxy resins or acrylic resins are employed. As methods for forming the first insulating layer 11, for instance, a spin coat method, a curtain coat method, a roll coat method, a dip coat method, etc. by which thickness is easily controlled may be used.

Then, a plurality of vias 24 are formed on the first insulating layer 11 formed on the build-up forming surface 2a of the base board 2. These vias 24 are formed correspondingly to lands 9a of the third wiring layer 9. The lands 9a face outward in the build-up forming surface 2a side. Further, when a photosensitive resin is used for the insulating dielectric material that forms the first insulating layer 11, these vias 24 are formed in accordance with a photolithography method by forming a mask formed to a prescribed pattern on the first insulating layer 11. However, a method for forming the vias is not limited to this method and the vias may be formed by other suitable method.

Then, the receiving electrode part forming step S-8 is carried out to form receiving electrode parts 21. In the receiving electrode parts 21, lower titanium layers 19 and electrode layers 20 serving as the lower electrodes of capacitors 12 or the receiving electrodes of resistors 13 are sequentially laminated on the surface of the insulating layer 11 on which the vias 24 are formed.

Figure 18:
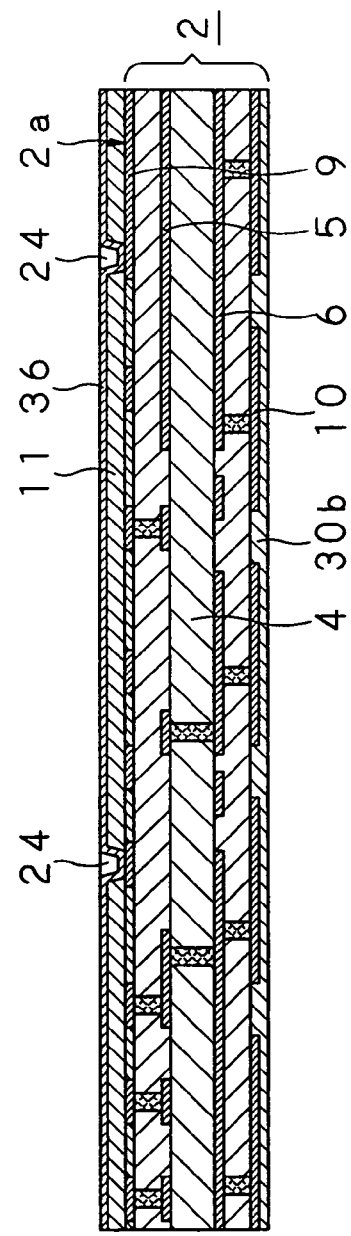
FIG. 18 is a longitudinally sectional view for explaining the manufacturing steps of the thin film circuit board device in which a titanium film is formed on the first insulating layer.
Figure 19:
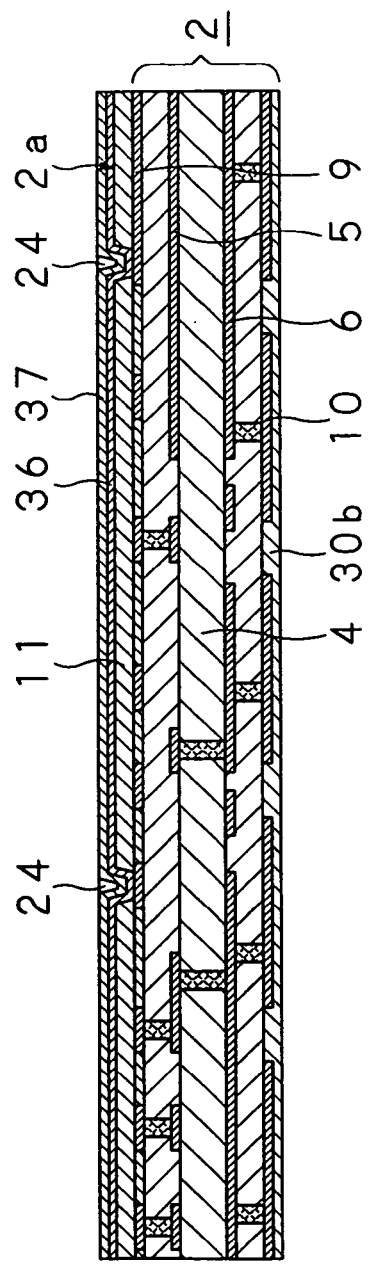
FIG. 19 is a longitudinally sectional view for explaining the manufacturing steps of the thin film circuit board device in which an electrode film is formed on the titanium film.

When the receiving electrode part forming step S-8 is applied to the first insulating layer 11, a titanium film 36 is firstly formed on all the surface of the first insulating layer 11 so as to have the thickness of about 200 Å as shown in FIG. 18. This titanium film 36 serves as the lower titanium layer 19 by patterning in a later step. This titanium film 36 is formed by, for instance, a sputtering method or an evaporation method or the like. Then, as shown in FIG. 19, an electrode film 37 serving as the electrode layer 20 is formed on all the surface of the titanium film 36 so as to have the thickness of about 2000 Å. Here, as the electrode film 37, metal such as Cu, Al, Au, Pt, etc. may be used, and Cu excellent in high frequency characteristics or patterning characteristics is used.

Figure 20:
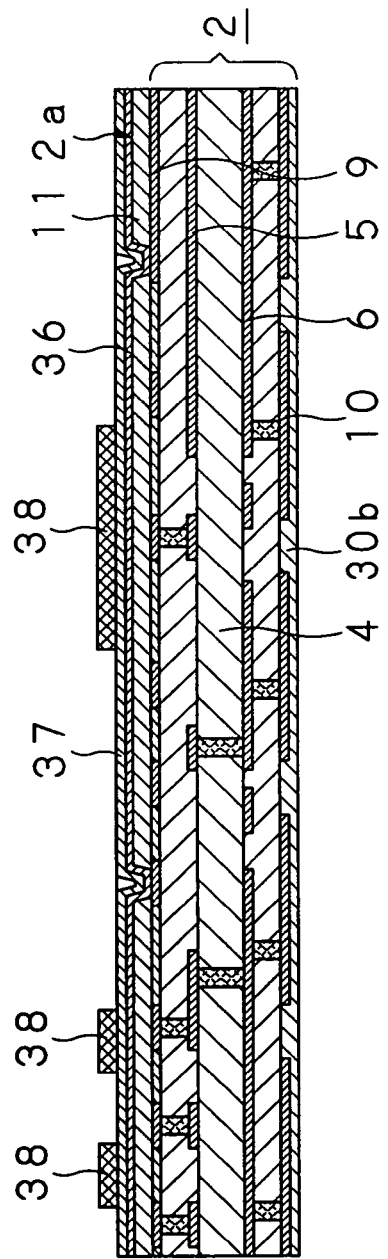
FIG. 20 is a longitudinally sectional view for explaining the manufacturing steps of the thin film circuit board device in which a mask is formed on the electrode film.
Figure 21:
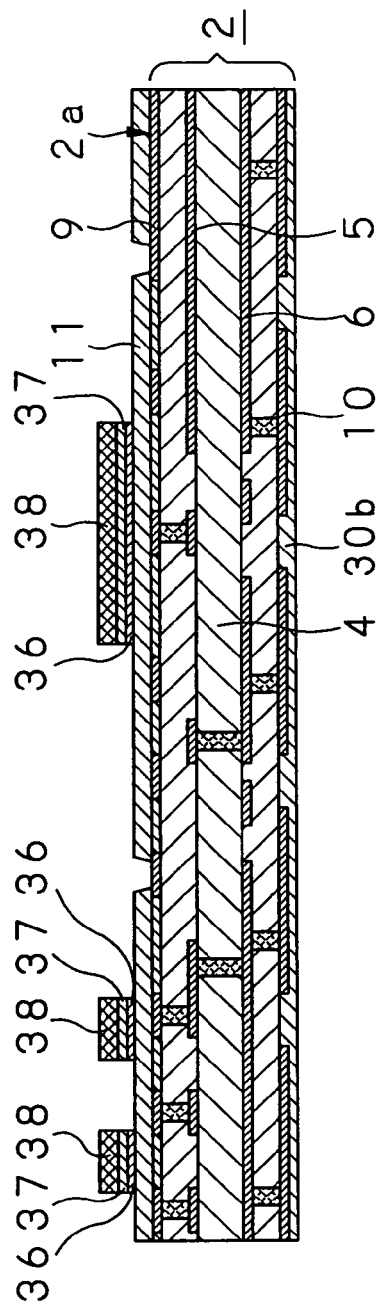
FIG. 21 is a longitudinally sectional view for explaining the manufacturing steps of the thin film circuit board device in which the electrode film and the titanium film are removed in areas except the mask.

Then, as shown in FIG. 20, masks 38 are patterned on parts in which the electrode layers 20 are formed on the electrode film 37. The masks 38 are formed in order to etch parts except the electrode layers 20 and the lower titanium layers 19 and a masking process by a resist film or the like is performed. Then, as shown in FIG. 21, an etching process is applied to the electrode film 37 having the masks 38 formed on its surfaces. This etching process is carried out by a wet etching in which mixed acid formed by mixing, for instance, nitric acid, sulfuric acid, acetic acid, etc. in the prescribed ratio is used as etchant. In the etching process, since the corrosiveness of the etchant composed of the mixed acid is low for the titanium film 36, the etching process is carried out until the titanium film 36 is exposed. Thus, only the electrode film 37 that is not masked can be corroded. In the electrode film 37, the parts masked by the masks 38 to which the etching process is not applied become the electrode layers 20.

Subsequently, the etching process is applied to the titanium film 36 that is not masked by the masks 38. The etching process is carried out by a wet etching in which mixed acid obtained by mixing, for instance, ammonium fluoride and ammonium bifluoride or the like in the prescribed ratio is used as etchant, or a plasma etching by $CF_4$ plasma, etc. In the etching process, since corrosiveness in the etchant or the $CF_4$ plasma is low for metal other than titanium, only the titanium film 36 can be corroded without corroding, for instance, the lands 9a exposed from the vias 24. Parts of the titanium film 36 that are masked by the masks 38 to hardly undergo an etching process become the lower titanium layers 19. The lower titanium layers 19 function for increasing the adhesion between the electrode layers 20 and the first insulating layer 11.

Figure 22:
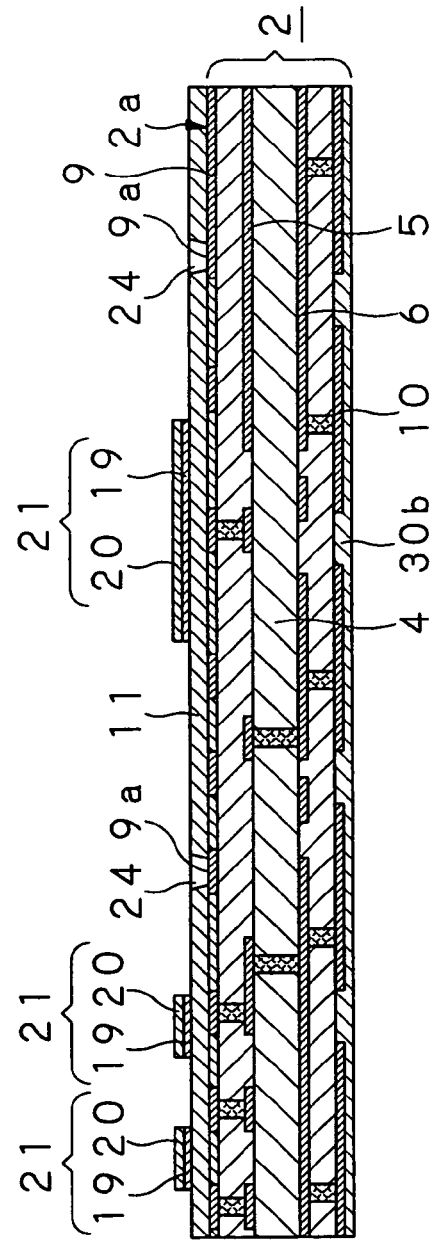
FIG. 22 is a longitudinally sectional view for explaining the manufacturing steps of the thin film circuit board device in which a receiving electrode part is formed on the first insulating layer.

Then, the masks 38 formed on the lower titanium layers 19 and the electrode layers 20 respectively obtained by performing the etching processes are removed. In such a way, on the first insulating layer 11, the receiving electrode parts 21 in which the lower titanium layers 19 and the electrode layers 20 are sequentially laminated are formed as shown in FIG. 22.

Subsequently, the first passive element forming step S-9 is carried out on the first insulating layer 11 on the surface of which the receiving electrode parts 21 are formed. Thus, the passive elements such as the capacitor 12 and the resistor 13 electrically connected to the receiving electrode parts 21 are formed.

Figure 23:
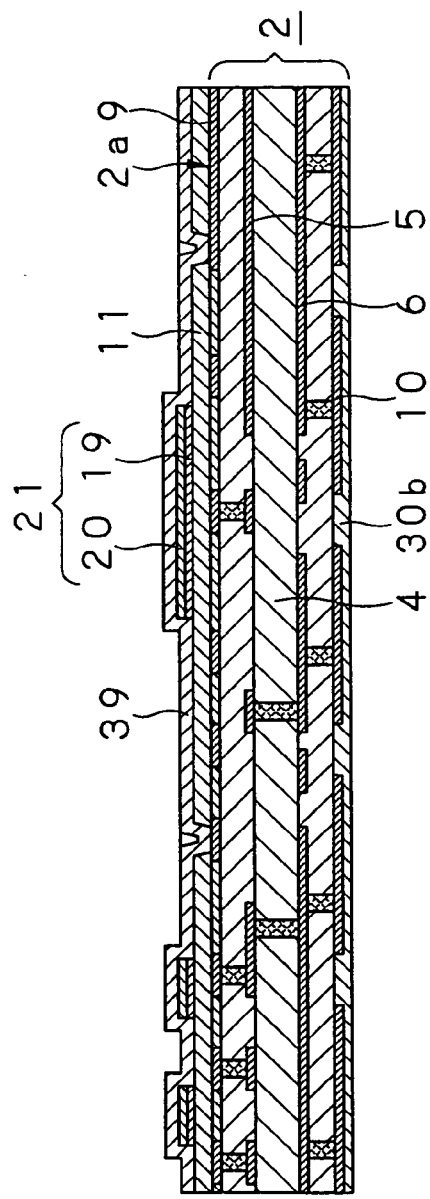
FIG. 23 is a longitudinally sectional view for explaining the manufacturing steps of the thin film circuit board device in which a resistor film for covering the receiving electrode part is formed on the first insulating layer.

When the passive elements are formed on the first insulating layer 11, a resistor film 39 made of, for instance tantalum nitride (TaN), tantalum (Ta), etc. is firstly formed on all the main surface of the first insulating layer 11 so as to cover the receiving electrode parts 21, as shown in FIG. 23. This resistor film 39 is a base film of a dielectric film made of tantalum oxide (TaO) which becomes a capacitor 12 by an anodic oxidation process. As a method for forming the resistor film 39, a sputtering method capable of forming a film having the thickness of, for instance, about 2000 Å or the like is employed.

Figure 24:
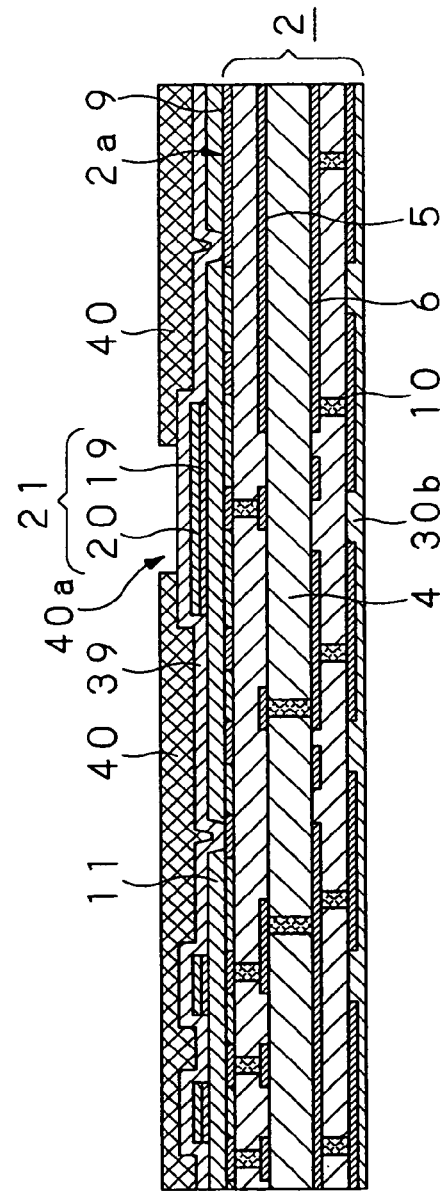
FIG. 24 is a longitudinally sectional view for explaining the manufacturing steps of the thin film circuit board device in which a mask is formed on the resistor film.

Then, as shown in FIG. 24, a mask 40 is formed on the surface of the resistor film 39 formed on the first insulating layer 11 in order to apply the anodic oxidation process only to a desired part. For the mask 40, a photoresist excellent in, for instance, patterning characteristics or $SiO_2$ excellent in insulating characteristics or the like is used to have such a thickness as to be adequately insulated from applied voltage due to the anodic oxidation process. Thus, the anodic oxidation process is applied only to the resistor film 39 facing outward from the opening part 40a of the mask 40.

Figure 25:
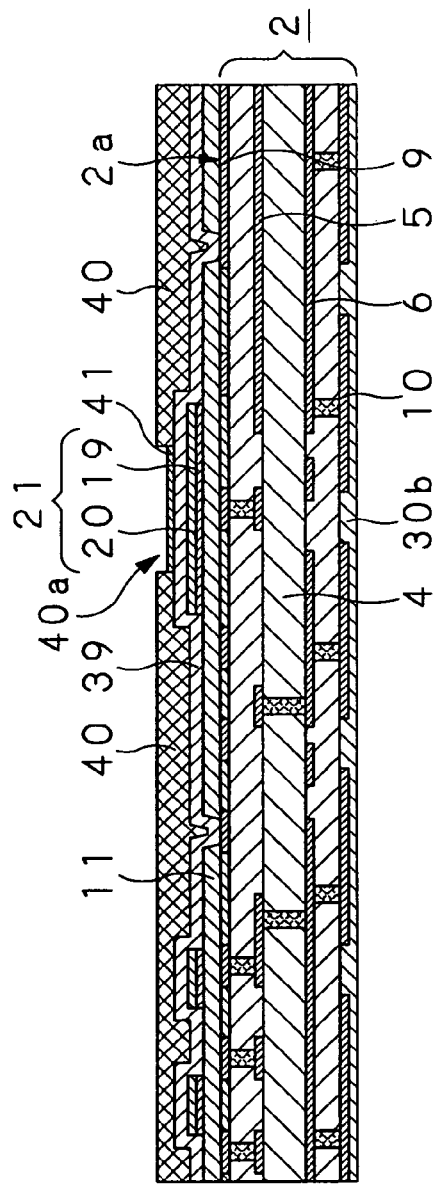
FIG. 25 is a longitudinally sectional view for explaining the manufacturing steps of the thin film circuit board device in which an anodic oxidation process is applied to the resistor film.
Figure 26:
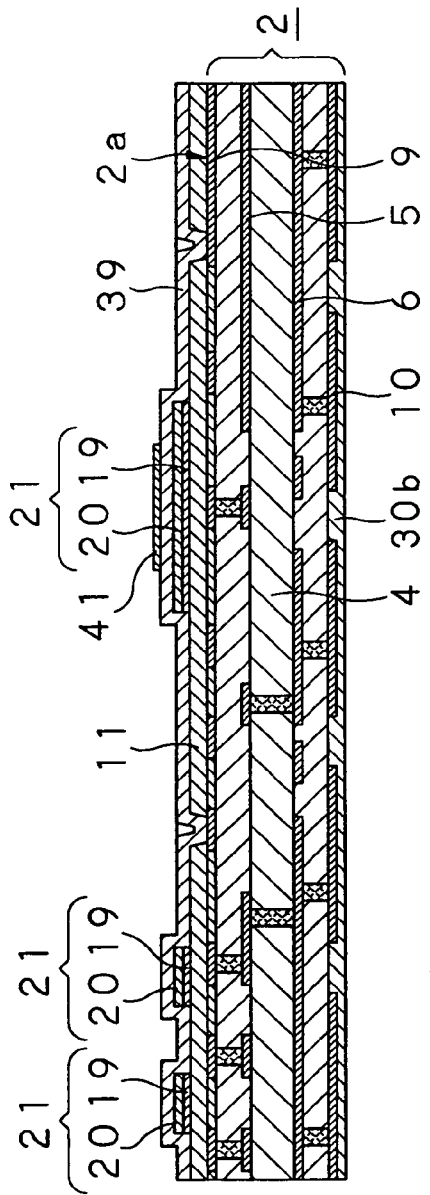
FIG. 26 is a longitudinally sectional view for explaining the manufacturing steps of the thin film circuit board device in which a TaO layer is formed on the resistor film.

Then, as shown in FIG. 25, the anodic oxidation process is applied to the resistor film 39 facing outward from the opening part 40a of the mask 40. In the anodic oxidation process, voltage of 50 to 200 V is applied so that the resistor film 39 becomes an anode in electrolyte solution such as ammonium borate to oxidize the resistor film 39 and partly form a TaO layer 41. The TaO layer 41 can be formed to have prescribed thickness by adjusting voltage applied to the resistor film 39. Then, as shown in FIG. 26, the mask 40 formed on the resistor film 39 to which the anodic oxidation process is applied is removed. Thus, the TaO layer 41 formed as a result of selectively oxidizing the surface of the resistor film 39 can be used as the dielectric material of the capacitor 12. Then, a dry etching process is applied to the resistor film 39 while parts in which the capacitor 12 and the resistor 13 are formed are masked by a resist or the like.

Figure 27:
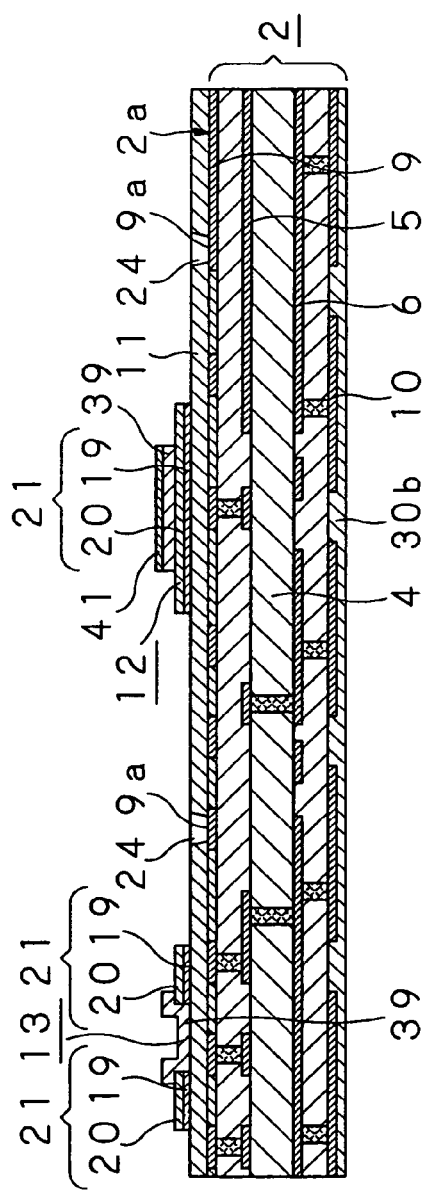
FIG. 27 is a longitudinally sectional view for explaining the manufacturing steps of the thin film circuit board device in which a capacitor and a resistor which are electrically connected to the receiving electrode part are formed on the first insulating layer.
Figure 28:
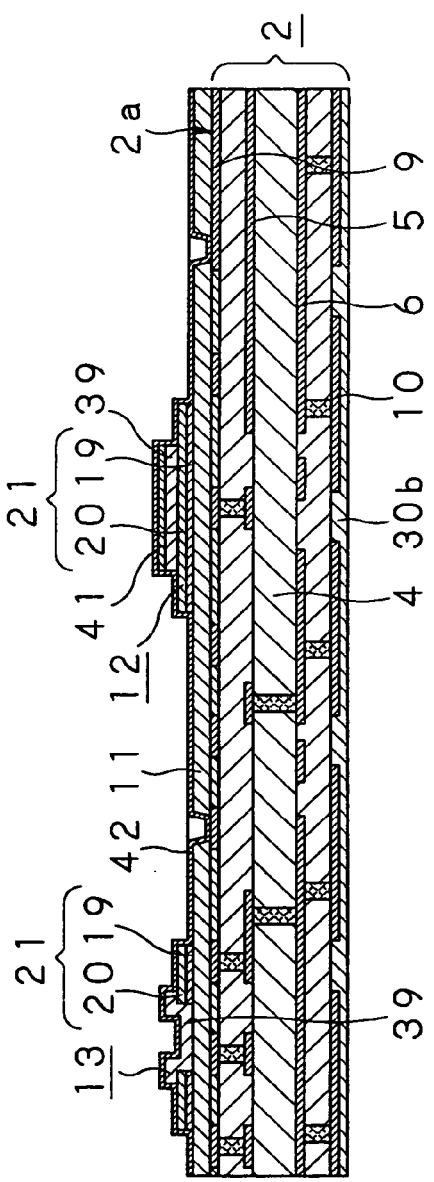
FIG. 28 is a longitudinally sectional view for explaining the manufacturing steps of the thin film circuit board device in which a substrate titanium film for covering the receiving electrode part and respective passive elements is formed on the first insulating layer.

In such a manner, as shown in FIG. 27, the capacitor 12 and the resistor 13 are patterned and formed on the first insulating layer 11 at the same time as the passive elements electrically connected to the receiving electrode parts 21. The resistor 13 may be patterned and formed after the TaO film is formed by applying the anodic oxidation process to all the surface of the resistor film 39 without using the mask 40. Also in this case, an oxide film is formed on the surface of the resistor 13 and this oxide film functions as a protective film, so that the high frequency characteristics of the resistor 13 can be stabilized for a long time.

After that, the first pattern wiring forming step S-10 is applied to the first insulating layer 11 having the passive elements formed on its main surface, so that the first pattern wiring 14 electrically connected to the receiving electrode parts 21 is patterned and formed.

Figure 29:
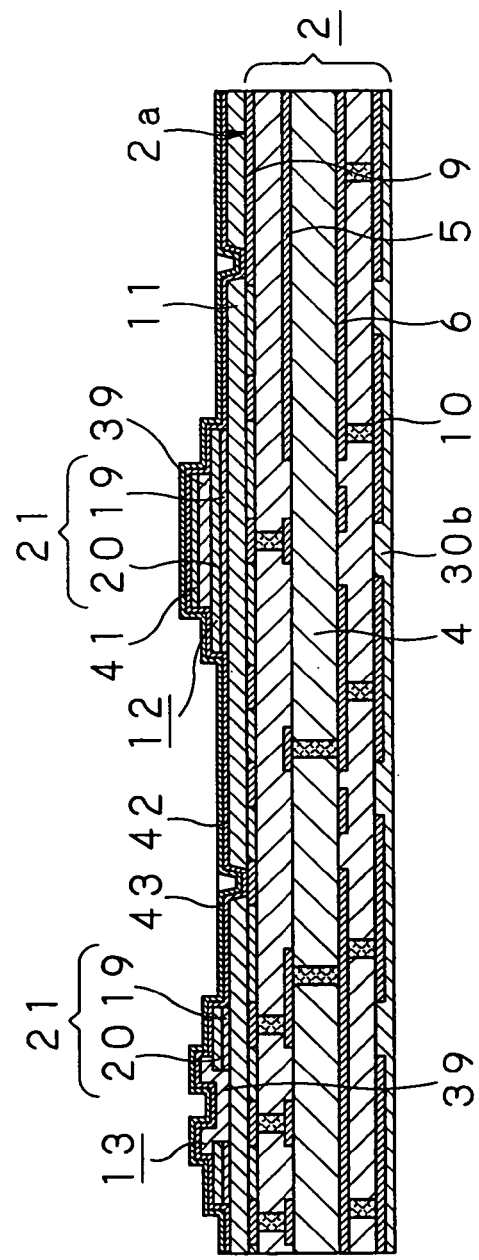
FIG. 29 is a longitudinally sectional view for explaining the manufacturing steps of the thin film circuit board device in which a substrate film is formed on the substrate titanium film.

When the first pattern wiring forming step S-10 is carried out on the first insulating layer 11, a substrate titanium film 42 serving as a substrate titanium layer 22 is firstly formed on all the surface of the first insulating layer 11 to have the thickness of about 200 Å so as to cover the capacitor 12, the resistor 13 and the receiving electrode parts 21. The substrate titanium film 42 is formed by, for instance, a sputtering method, an evaporation method, etc. Then, as shown in FIG. 29, a substrate film 43 serving as a substrate layer 23 is formed on all the surface of the substrate titanium film 42 to have the thickness of about 2000 Å. Here, as the substrate film 43, for instance, Cu excellent in high frequency characteristics or patterning characteristics or the like is used. As the substrate film 43, metal other than Cu such as Al, Au, Pt, etc., can be used.

Figure 30:
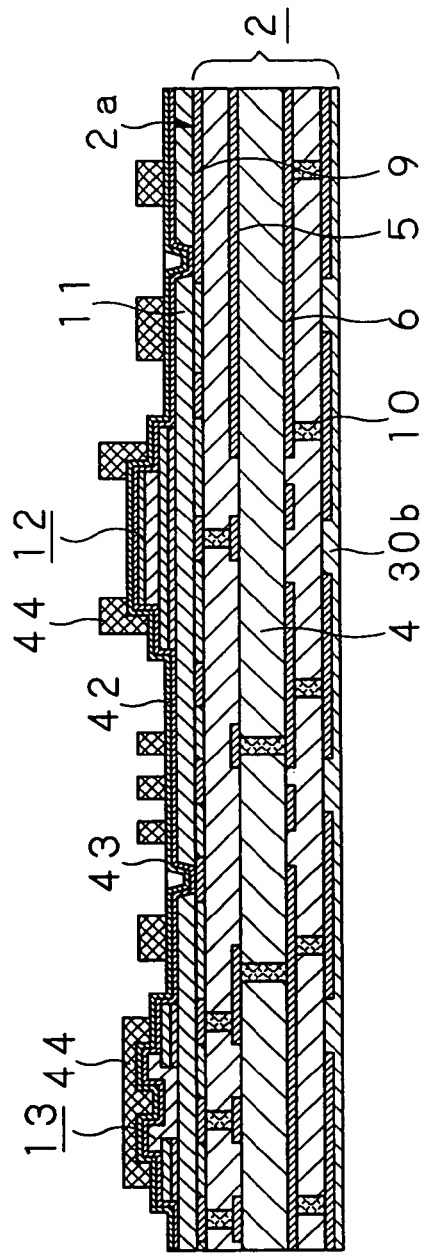
FIG. 30 is a longitudinally sectional view for explaining the manufacturing steps of the thin film circuit board device in which a mask is formed on the substrate film.
Figure 31:
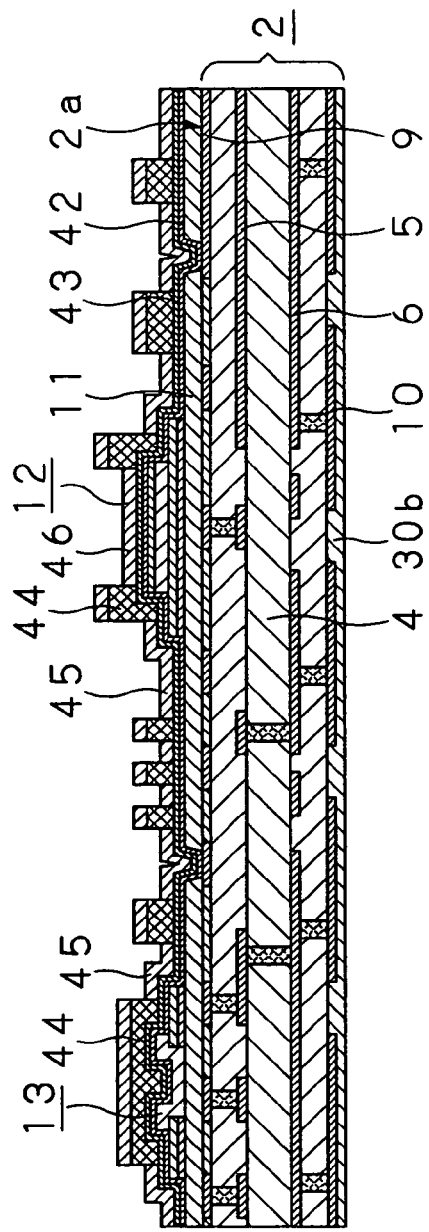
FIG. 31 is a longitudinally sectional view for explaining the manufacturing steps of the thin film circuit board device in which a metallic film is patterned and formed on the substrate film.

Then, as shown in FIG. 30, a mask 44 having the thickness of about 12 μm for opening parts in which the first pattern wiring 14 is formed is patterned and formed on the substrate film 43 by, for instance a photolithography method. A method for forming the mask 44 is not limited to the photolithography method and the mask 44 may be formed by other suitable method or other material. Then, as shown in FIG. 31, a metallic film 45 made of, for instance, Cu and having the thickness of 10 μm is formed on the first insulating layer 11 on which the mask 44 is formed by, for example, a plating method. The metallic film 45 becomes the first pattern wiring 14 by patterning the substrate film 43 and the substrate titanium film 42 as the lower layer by a wet type etching process in a later step. The metallic film 45 formed on the capacitor 12 becomes an upper electrode layer 46 for electrically connecting the capacitor 12 to the second pattern wiring 17.

Figure 32:
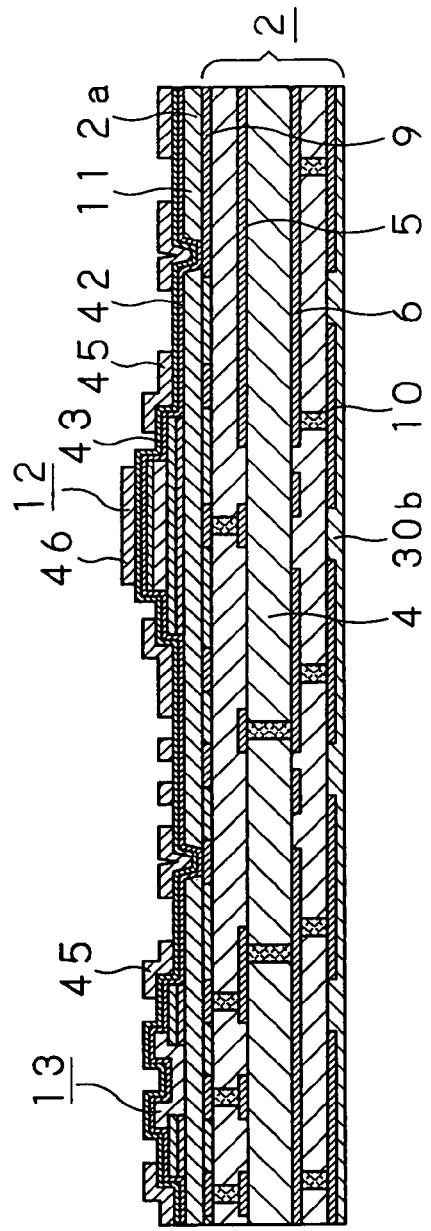
FIG. 32 is a longitudinally sectional view for explaining the manufacturing steps of the thin film circuit board device in which the mask on the substrate film is removed.
Figure 33:
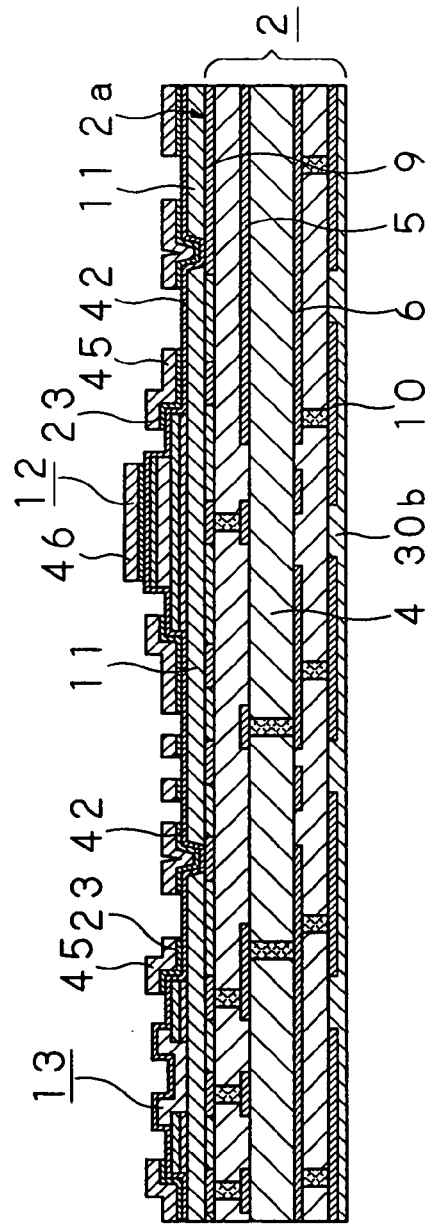
FIG. 33 is a longitudinally sectional view for explaining the manufacturing steps of the thin film circuit board device in which the substrate film in areas except the metallic film is removed to form a substrate layer.

Then, as shown in FIG. 32, the mask 44 is removed from the substrate film 43. Then, as shown in FIG. 33, the etching process is applied to the substrate films 43 exposed in areas where the metallic films 45 are not formed. This etching process is carried out by a wet etching in which mixed acid obtained by mixing, for instance, nitric acid, sulfuric acid, acetic acid, etc. at the prescribed ratio is used as etchant. In this etching process, since the corrosiveness of the etchant composed of the mixed acid is low relative to the substrate titanium film 42, the etching process can be carried out until the substrate titanium film 42 is exposed. Thus, only the substrate films 43 in the areas where the metallic films 45 are not formed can be corroded. The parts of the substrate film 43 that are masked by the metallic films 45 so that the etching process is not applied thereto become patterned substrate layers 23. At this time, the metallic films 45 are corroded by the etchant that etches the substrate film 43, however, the thickness of the metallic films 45 is sufficiently larger than the thickness of the substrate film 43. Accordingly, the thickness of the metallic films 45 is suppressed to a slight decrease.

Figure 34:
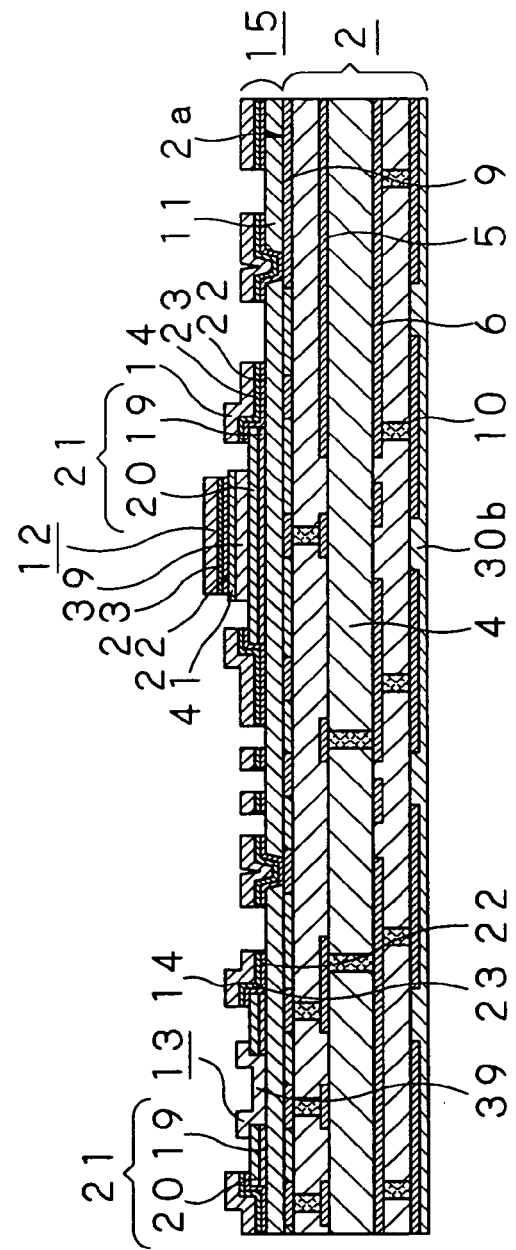
FIG. 34 is a longitudinally sectional view for explaining the manufacturing steps of the thin film circuit board device in which the substrate titanium film in areas except the metallic film is removed to form a substrate titanium layer and a first pattern wiring.

Then, as shown in FIG. 34, the etching process is applied to the substrate titanium films 42 exposed in the areas where the metallic films 45 are not formed. This etching process is carried out by the wet etching in which mixed acid obtained by mixing, for instance, ammonium fluoride and ammonium bifluoride, etc. in the prescribed ratio is used as etchant or a the plasma etching by $CF_4$ plasma or the like. In this etching process, since the corrosiveness of the etchant or the $CF_4$ plasma is low relative to metal other than titanium, only the substrate titanium films 42 can be corroded without corroding, for instance, the metallic films 45 or the electrode layer 20. The parts of the substrate titanium films 42 that are masked by the metallic films 45 so that the etching process is not applied thereto become the patterned substrate titanium layer 22. The substrate titanium layer 22 functions to improve the adhesion between the substrate layer 23 and, for instance, the first insulating layer 11, the receiving electrode part 21, and the TaO layer 41 of the capacitor 12.

In such a way, the first pattern wiring 14 electrically connected to the electrode layer 20 and having the substrate titanium layer 22 and the substrate layer 23 as a substrate is patterned and formed on the first insulating layer 11. Thus, the first pattern wiring 14 forms the first high frequency layer 15 patterned and formed on the build-up forming surface 2a through the first insulating layer 11.

In the first pattern wiring forming step S-10 as described above, when the etching process is applied respectively to the substrate film 43 and the substrate titanium film 42, the etchants that selectively corrode the metals to be corroded are respectively used. When the etching process is applied to the substrate film 43, the corrosion of the substrate titanium film 42 by the etchant is suppressed. Thus, the substrate titanium film 42 serving as the substrate titanium layer 22 functions as a protective film for preventing the corrosion of the capacitor 12, the resistor 13 and the receiving electrode parts 21 by the etchant. On the other hand, when the etching process is applied to the substrate titanium film 42, the corrosion of the metallic films 45, the receiving electrode parts 21 and the respective passive elements or the like by the etchant is suppressed. Thus, only the substrate titanium film 42 is corroded.

Accordingly, in the first pattern wiring forming step S-10, the substrate titanium film 42 serving as the substrate titanium layer 22 prevents the corrosion of the metallic films 45, the receiving electrode parts 21, the passive elements, etc. by the etchant upon etching process in the substrate film 43. Thus, the first pattern wiring 14 in which the electric connection of the passive elements to the receiving electrode parts 21 is not broken can be properly formed.

Figure 35:
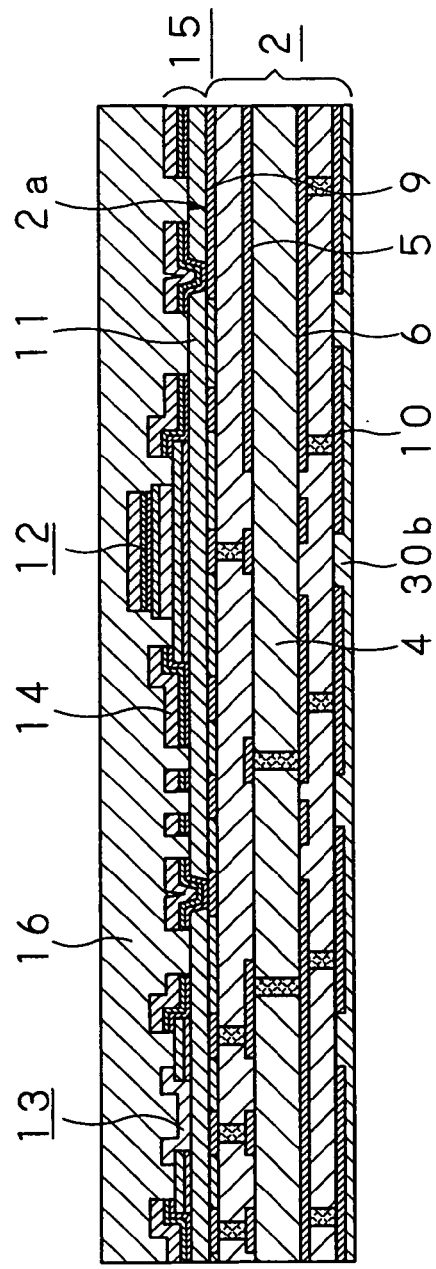
FIG. 35 is a longitudinally sectional view for explaining the manufacturing steps of the thin film circuit board device in which a second insulating layer for covering the first pattern wiring is formed on the first insulating layer.

Subsequently, as shown in FIG. 35, the second insulating layer forming step S-11 is applied to the first insulating layer 11 on which the first pattern wiring 14 is patterned and formed to form the second insulating layer 16 made of an insulating dielectric material. As for the insulating dielectric material forming the second insulating layer 16, a material similar to that of the core board 4 and the first insulating layer 11 is used which has a low dielectric constant and low Tan $\delta$, that is, a material excellent in its high frequency characteristics and excellent in its heat resistance or chemical resistance. Specifically, as the insulating dielectric materials, for instance, benzocyclobutene (BCB), polyimide, polynorbornene (PNB), liquid crystal polymer (LCP), epoxy resins, acrylic resins, etc. are employed. Then, the second insulating layer 16 is formed on the first insulating layer 11 so as to cover the first pattern wiring 14 and the passive elements respectively in the same manner as that of the first insulating layer 11.

Figure 36:
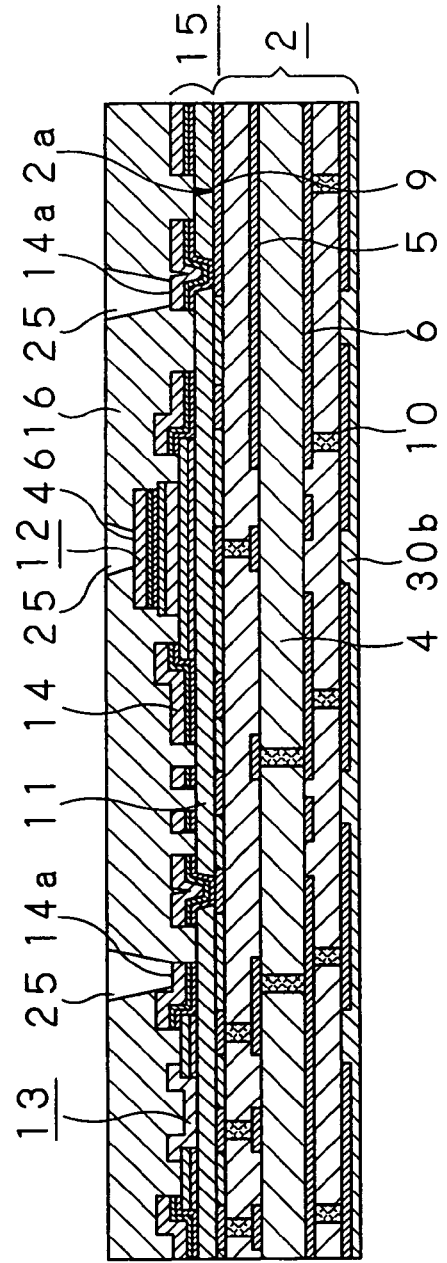
FIG. 36 is a longitudinally sectional view for explaining the manufacturing steps of the thin film circuit board device in which via holes are formed in the second insulating layer.

Then, as shown in FIG. 36, a plurality of vias 25 are formed in the second insulating layer 16 formed on the first insulating layer 11. These vias 25 are formed correspondingly to the upper electrode layer 46 formed on the capacitor 12 and lands 14a of the first pattern wiring 14 to face the upper electrode layer 46 and the lands 14a outward. When a photosensitive resin is used for the insulating dielectric material forming the second insulating layer 16, a mask formed in a prescribed pattern is formed on the second insulating layer 16 to form the vias 25 by a photolithography method. The method for forming the vias 25 is not limited to this method and the vias may be formed by other suitable methods.

Figure 37:
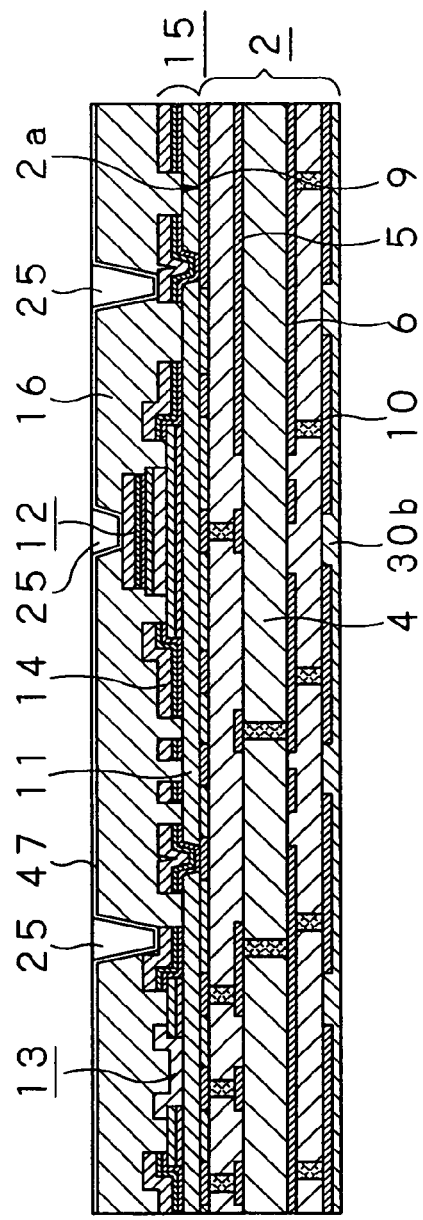
FIG. 37 is a longitudinally sectional view for explaining the manufacturing steps of the thin film circuit board device in which a substrate titanium film is formed on the second insulating layer.
Figure 38:
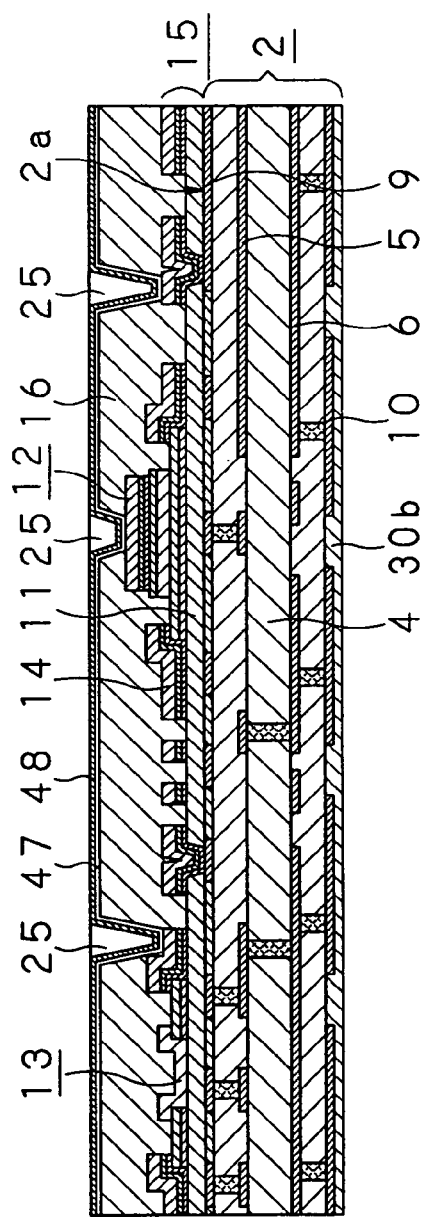
FIG. 38 is a longitudinally sectional view for explaining the manufacturing steps of the thin film circuit board device in which a substrate film is formed on the substrate titanium film.

Then, the second pattern wiring 17 having passive elements such as inductors is patterned and formed on the second insulating layer 16 by the second pattern wiring forming step S-12. When the second pattern wiring 17 is formed on the second insulating layer 16, a substrate titanium film 47 is formed on all the surface of the second insulating layer 16 so as to have the thickness of about 200 Å, as shown in FIG. 37. This substrate titanium film 47 is formed by, for instance, a sputtering method or an evaporation method. Then, as shown in FIG. 38, a substrate film 48 is formed on all the surface of the substrate titanium film 47 so as to have the thickness of about 2000 Å. Here, as the substrate film 48, for instance, Cu or the like excellent in high frequency characteristics or patterning characteristics is used. As the substrate film 48, metal other than Cu, for instance, Al, Au, Pt, etc. may be employed.

Figure 39:
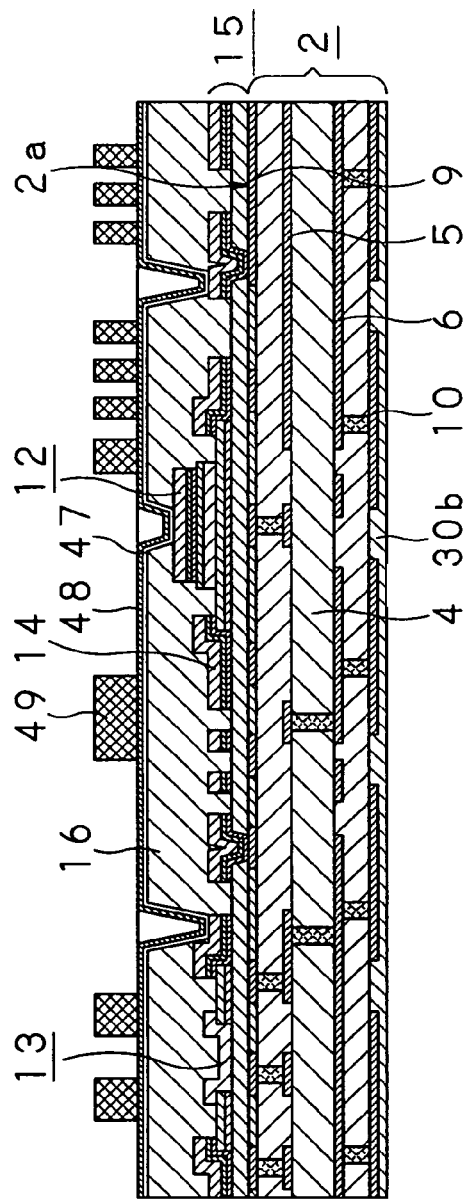
FIG. 39 is a longitudinally sectional view for explaining the manufacturing steps of the thin film circuit board device in which a mask is formed on the substrate film.
Figure 40:
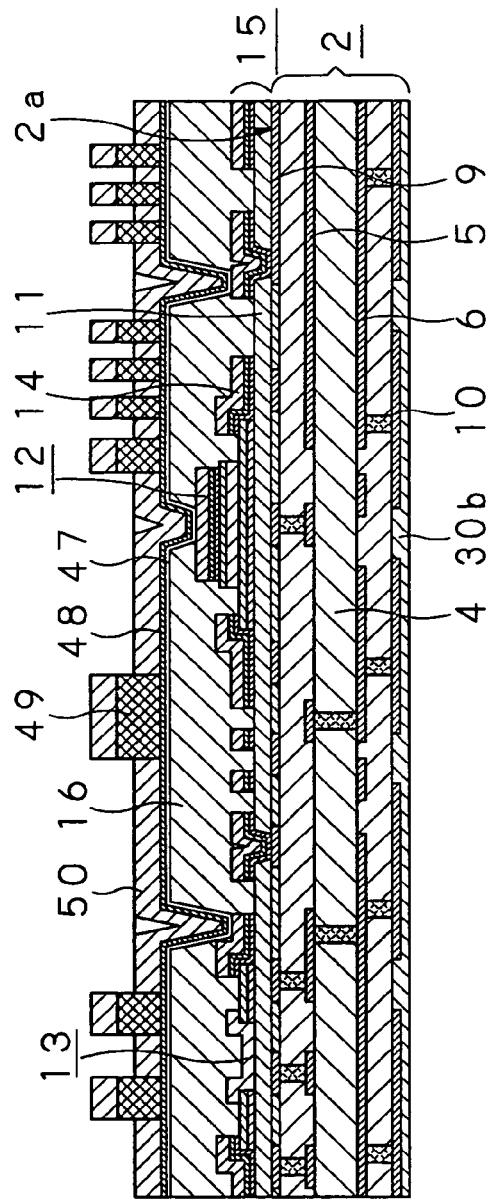
FIG. 40 is a longitudinally sectional view for explaining the manufacturing steps of the thin film circuit board device in which a metallic film is patterned and formed on the substrate film.

Then, as shown in FIG. 39, a mask 49 having the thickness of about 12 μm for opening parts in which the second pattern wiring 17 is formed is patterned and formed on the substrate film 48, by for instance, a photolithography method. The method for forming the mask 49 is not limited to the photolithography method and the mask 49 may be formed by other suitable methods or materials. Then, as shown in FIG. 40, a metallic film 50 having the thickness of approximately 10 μm is formed on the second insulating layer 16 on which the mask 49 is formed by, for instance, a plating method. The metallic film 50 becomes the second pattern wiring 17 by applying a wet type etching process respectively to the substrate film 48 and the substrate titanium film 47 as a substrate in a later step.

Figure 41:
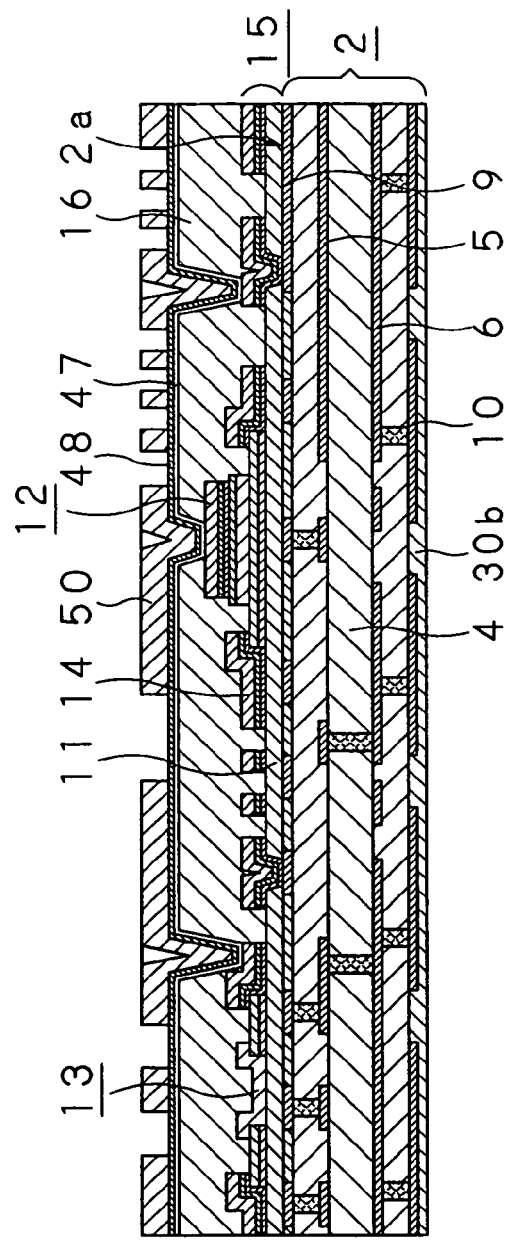
FIG. 41 is a longitudinally sectional view for explaining the manufacturing steps of the thin film circuit board device in which the mask on the substrate film is removed.
Figure 42:
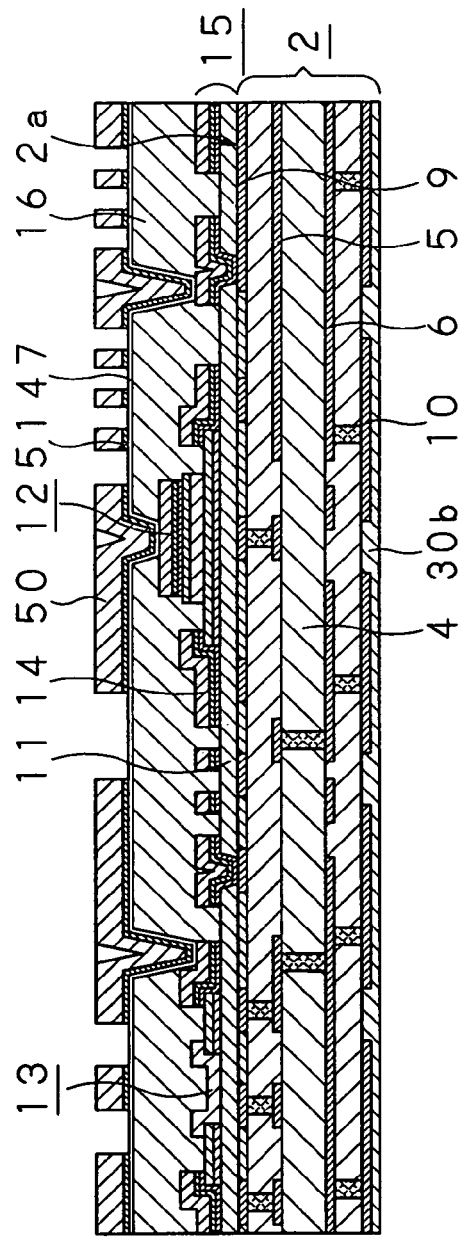
FIG. 42 is a longitudinally sectional view for explaining the manufacturing steps of the thin film circuit board device in which the substrate film in areas except the metallic film is removed to form a substrate layer.

Then, as shown in FIG. 41, the mask 49 is removed from the substrate film 48. Then, as shown in FIG. 42, the etching process is applied to the substrate films 48 exposed in areas where the metallic films 50 are not formed. The etching process can be properly applied to the substrate films 48 in the areas where the metallic films 50 are not formed by using the same etchant as that of the wet etching process applied to the substrate film 43. Parts of the substrate film 48 that are masked by the metallic films 50 so that the etching process is not applied thereto become a patterned substrate layer 51. Although the metallic film 50 is corroded by the etchant that etches the substrate film 48, the thickness of the metallic film 50 is sufficiently larger than the thickness of the substrate film 48, and accordingly, the thickness of the metallic film 50 is suppressed to a small decrease.

Figure 43:
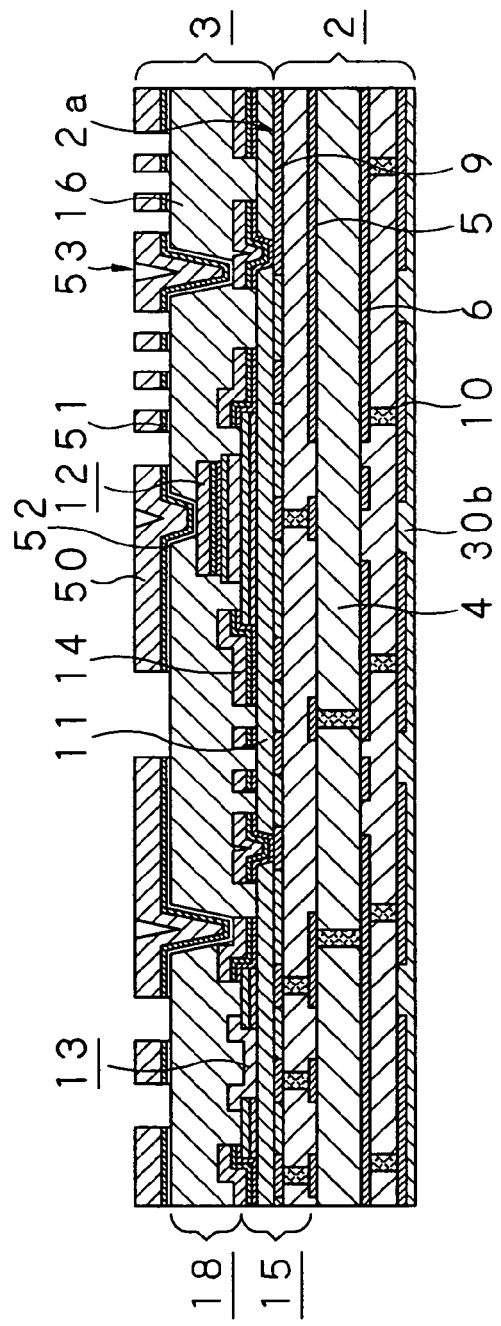
FIG. 43 is a longitudinally sectional view for explaining the manufacturing steps of the thin film circuit board device in which the substrate titanium film in areas except the metallic film is removed to form a substrate titanium layer and a second pattern wiring.

Then, as shown in FIG. 43, the etching process is applied to the substrate titanium films 47 in the areas where the metallic films 50 are not formed. In the etching process, the same etchant and the same $CF_4$ plasma as those of the wet etching process applied to the substrate titanium film 42 are used. Thus, the etching process can be applied only to the substrate titanium film 47 without corroding the upper electrode part 46, the lands 14a or the like exposed from, for instance, the metallic film 50 or the vias 25. Then, parts of the substrate titanium film 47 that are masked by the metallic films 50 so that the etching process is not applied thereto become a patterned substrate titanium layer 52. The substrate titanium layer 52 serves to improve an adhesion between the substrate layer 51 and, for instance, the second insulating layer 16.

In such a way, the second pattern wiring 17 having the substrate layer 51 and the substrate titanium layer 52 as a substrate is patterned and formed on the second insulating layer 16. When the second pattern wiring 17 is patterned and formed, an inductor 53 is patterned and formed on a part of the second pattern wiring 17. In the inductor 53, a series resistance value constitutes a problem. However, the second pattern wiring 17 is patterned and formed to have a sufficient thickness by a plating method as mentioned above. Thus, since the inductor can adequately function even in low frequency, so that the loss of characteristics of the inductor can be suppressed. Accordingly, the second pattern wiring 17 patterned and formed on the first insulating layer 11 through the second insulating layer 16 becomes the second high frequency layer 18.

The circuit part 3 comprising the first high frequency layer 15 and the second high frequency layer 18 is formed on the build-up forming surface 2a of the base board 2 through the above-described steps.

Figure 44:
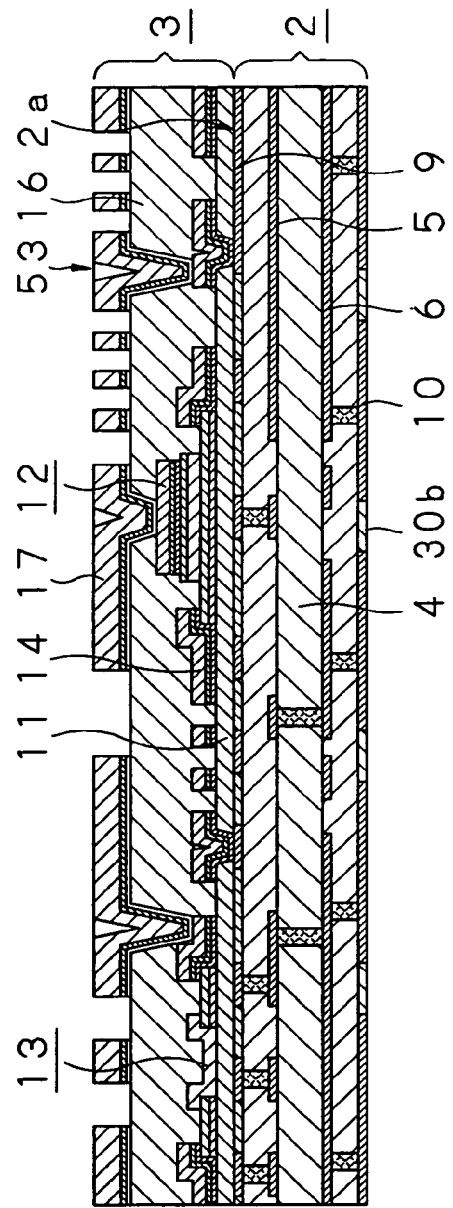
FIG. 44 is a longitudinally sectional view for explaining the manufacturing steps of the thin film circuit board device in which input and output terminal parts are exposed from the mother board mounting surface of the base board.
Figure 45:
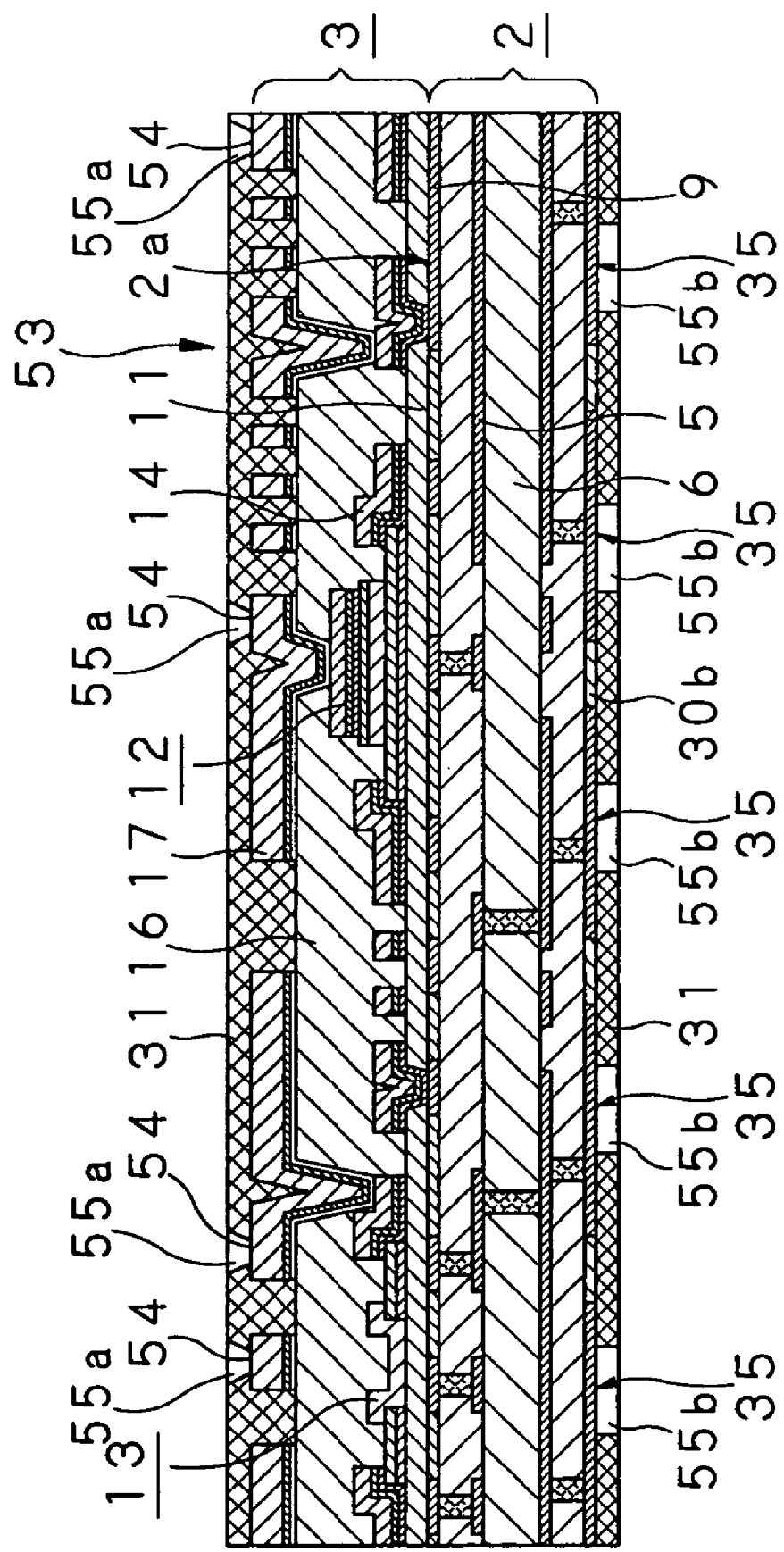
FIG. 45 is a longitudinally sectional view for explaining the manufacturing steps of the thin film circuit board device in which resist layers are formed on main front and back surfaces.

Then, as shown in FIG. 44, a grinding process is applied to the resin layer 30b in the second main surface 4b side in the core board 4 of the base board 2 to form the fourth wiring layer 10, that is, to expose input and output terminal parts 35 electrically connected to the mother board 93. Then, as shown in FIG. 45, the resist layers 31 are respectively formed on all the surface of the circuit part 3 and all the main surface of the fourth wiring layer 10 side of the base board 2 by the resist layer forming step S-13.

Figure 46:
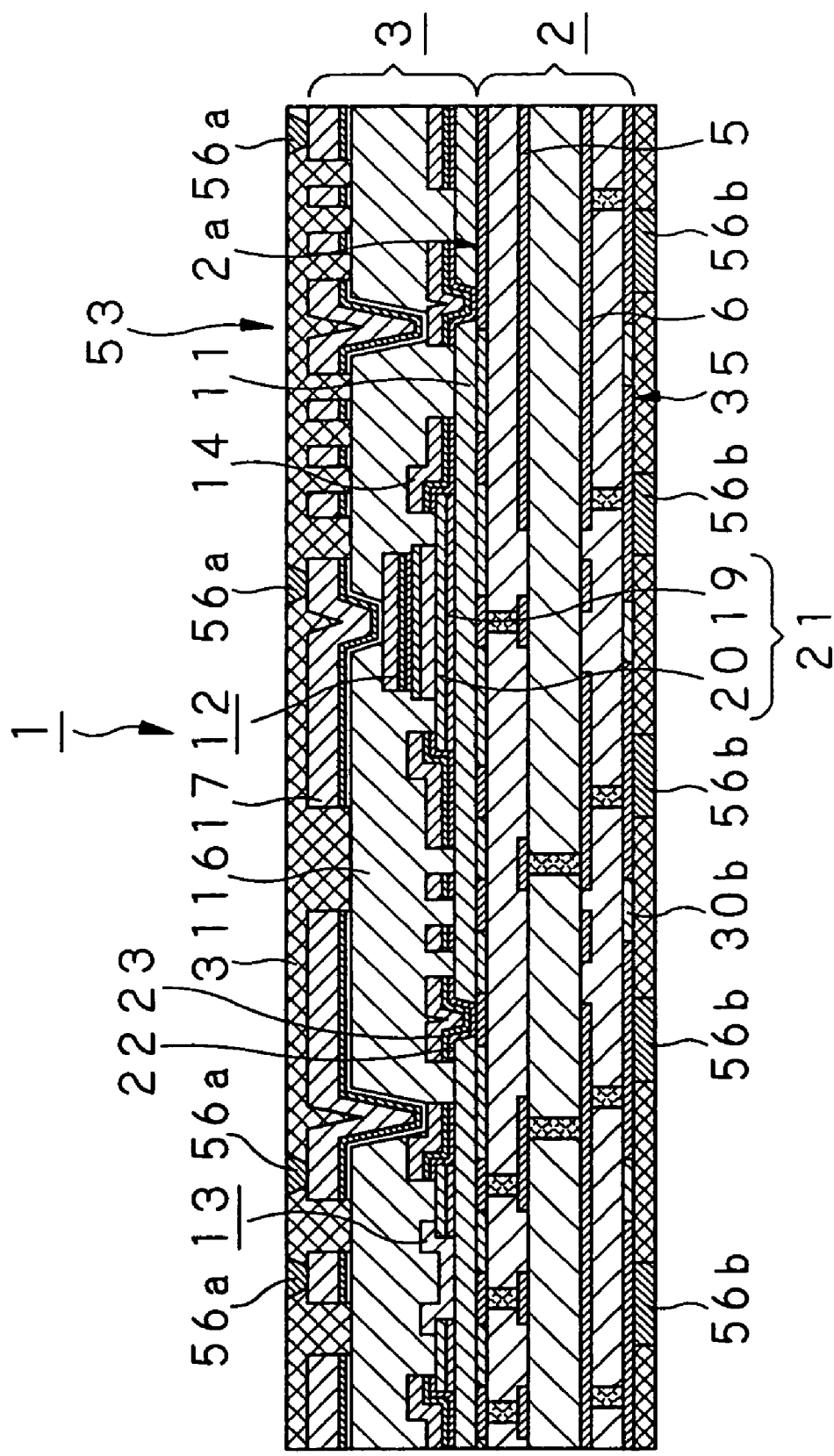
FIG. 46 is a longitudinally sectional view for explaining the manufacturing steps of the thin film circuit board device showing a completed thin film circuit board.

Then, the photolithography process is applied to these resist layers 31 through patterned and formed masks to form opening parts 55a which lands 54 face at prescribed positions and opening parts 55b which the input and output terminal parts 35 face. Then, as shown in FIG. 46, an electroless nickel/copper plating process is applied to the lands 54 and input and output terminal parts 35 exposed in these opening parts 55a and 55b to respectively form electrode terminals 56a and 56b. In such a manner, the circuit board 1 is formed.

The circuit board 1 manufactured in this manner has such a structure as described below. The receiving electrode parts 21 in which the lower titanium layers 19 and the electrode layers 20 are sequentially laminated in prescribed areas on the first insulating layer 11 in the circuit part 3. The etching process is respectively applied to the substrate titanium film 42 and the substrate film 43 for covering the receiving electrode parts 21 and the respective passive elements formed on the first insulating layer 11. Thus, the substrate titanium layer 22 and the substrate layer 23 are sequentially laminated as the substrate of the first pattern wiring 14.

Thus, in the circuit board 1 according to the present invention, the lower titanium layer 22 functions for improving the adhesion between the first insulating layer 11, the receiving electrode parts 21 and the respective passive elements, and the substrate layer 23 in the first high frequency layer 15. The substrate titanium film 42 serving as the substrate titanium layer 22 functions as a protective film for preventing the corrosion of the receiving electrode parts 21, the capacitor 12 and the resistor 13 by the etchant when the substrate layer 23 is patterned under the etching process. Consequently, an electric insulation failure between the passive elements and the first pattern wiring 14 is prevented and the adhesion to the first insulating layer 11 is improved. Further, the capacitor 12 and the resistor 13 having high performance whose deterioration due to the corrosion by the etchant is suppressed can be formed.

In the circuit board 1 according to the present invention, the substrate titanium layer 52 functions for improving the adhesion between the second insulating layer 16 and the substrate layer 51 in the second high frequency layer 18. The substrate titanium film 47 serving as the substrate titanium layer 52 functions as a protective film for preventing the corrosion of the upper electrode layer 46 and the lands 14a or the like by the etchant when the substrate film 48 is patterned by the etching process. Consequently, an electric insulation failure between the upper electrode layer 46 and the lands 14a and the second pattern wiring 17 is prevented and the inductor 53 of high performance whose adhesion to the second insulating layer 16 is improved can be formed.

Further, in the circuit board 1, the wiring layers of a power supply, a ground, etc. are formed on the base board 2 and the passive elements, etc. are respectively formed on the circuit part 3. Thus, both the members are electrically separated from each other, the generation of electrical interference is suppressed and high frequency characteristics can be improved.

Still further, in the circuit board 1, the wiring layers respectively laminated on the base board 2, the passive elements respectively laminated on the circuit part 3, and the high density pattern wiring 14 and 17 can be patterned and formed by the thin film technique. Thus, thin and compact circuit board 1 can be realized.

Still further, in the circuit board 1, the base board 2 having the core board 4 as the core is mainly composed of the above-described organic materials. Thus, the circuit board 1 is relatively inexpensive as compared with a circuit board in which a relatively expensive Si substrate or a glass substrate is used as a base board. Accordingly, in the base board 1, the cost of the material can be reduced.

Furthermore, in the circuit board 1, methods for forming the first high frequency layer 15 and the second high frequency layer 18 are sequentially repeated so that the pattern wiring having the passive elements formed on a part thereof can be patterned and formed in multi-layers not less than three layers.

In the above-described circuit board 1, although the TaO capacitor using the TaO layer 41 as the dielectric film is described as the capacitor 12 of an example, the present invention is not limited thereto. For instance, a capacitor between layers in which insulating layers are respectively made of wiring layers and/or pattern wiring as dielectric materials may be used.

In the circuit board 1 manufactured as mentioned above, the high frequency IC 90 or the chip parts 91 are mounted on the mounting surface 3a of the circuit part 3 through the electrode terminals 56a by a suitable mounting method such as a flip chip mounting method, as described above. In the circuit board 1, the mother board mounting surface 2b of the base board 2 is mounted on the mother board 93 through the electrode terminals 56b by the flip chip mounting method or solder balls or the like. While the high frequency IC 90 or the like is mounted on the circuit board 1, the shield cover 92 for eliminating the influence of electromagnetic noise is attached to the circuit board 1 to cover the mounting surface 3a of the circuit part 3. Thus, the high frequency module device 94 is formed.

In the high frequency module device 94, the circuit part 3 of the circuit board 1 is covered with the shield cover 92 as described above. Thus, heat generated from the high frequency IC 90 or the chip parts 91 mounted on the mounting surface 3a of the circuit part 3 may possibly give an adverse influence to circuit characteristics stored in the shield cover 92. Therefore, a suitable heat radiating mechanism is preferably provided in the high frequency module device 94.

Figure 47:
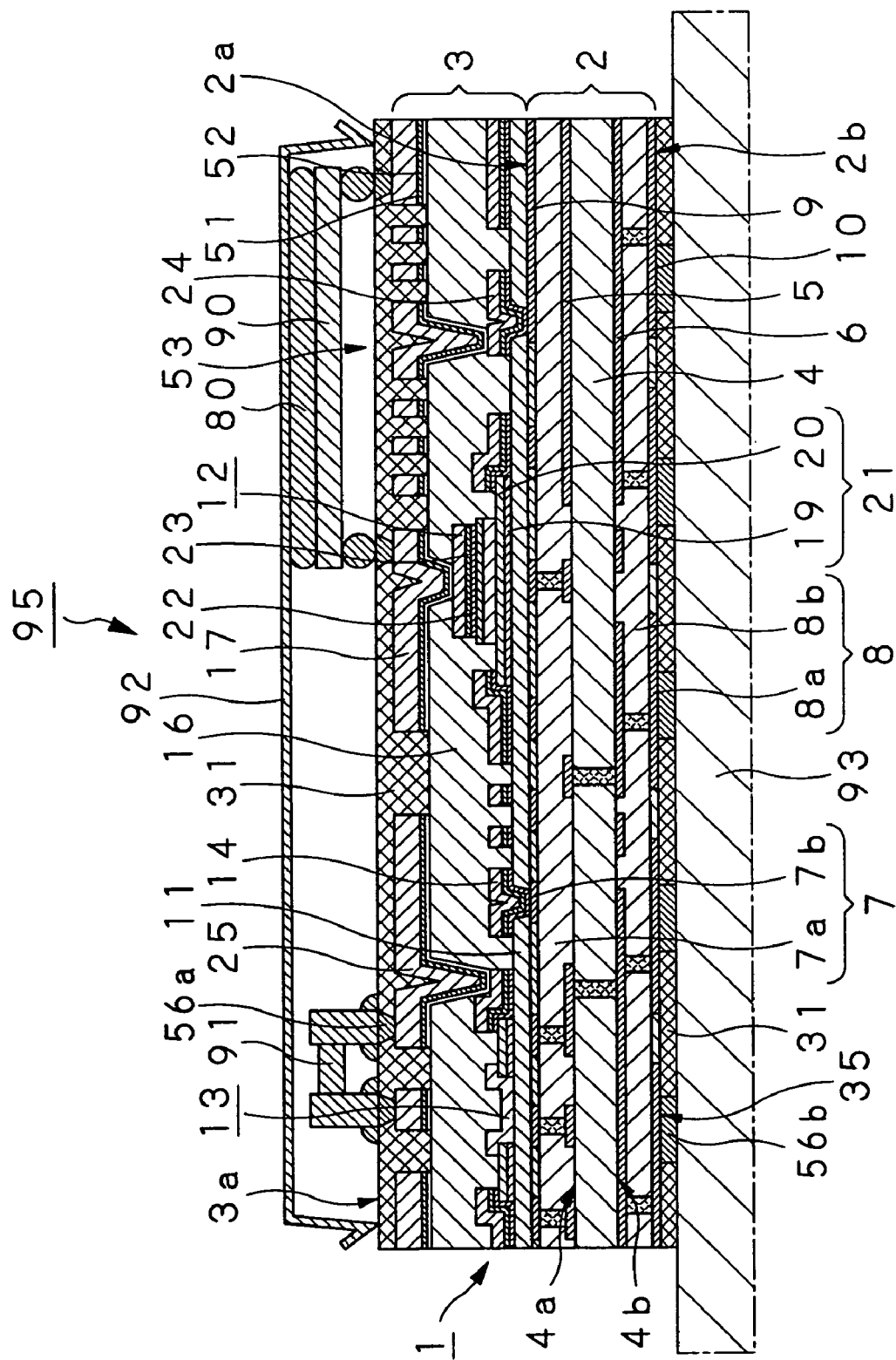
FIG. 47 is a main part longitudinally sectional view of a high frequency module device having a heat radiating mechanism.

In a high frequency module device 95 shown in FIG. 47, a part between the upper surface of the high frequency IC 90 high in its quantity of generated heat and the inner surface of the shield cover 92 is filled with a thermally conductive resin material 80. Thus, a heat radiating structure is formed. In the high frequency module device 95, the heat generated from the high frequency IC 90 is transferred to the shield cover 92 through the thermally conductive resin material 80 and radiated through the shield cover 92. Thus, the heat is prevented from being confined therein and giving an adverse effect to characteristics. In the high frequency module device 95, the relatively large high frequency IC 90 is held by the shield cover 92 and the thermally conductive resin material 80, so that a mechanical mounting rigidity can be improved.

Figure 48:
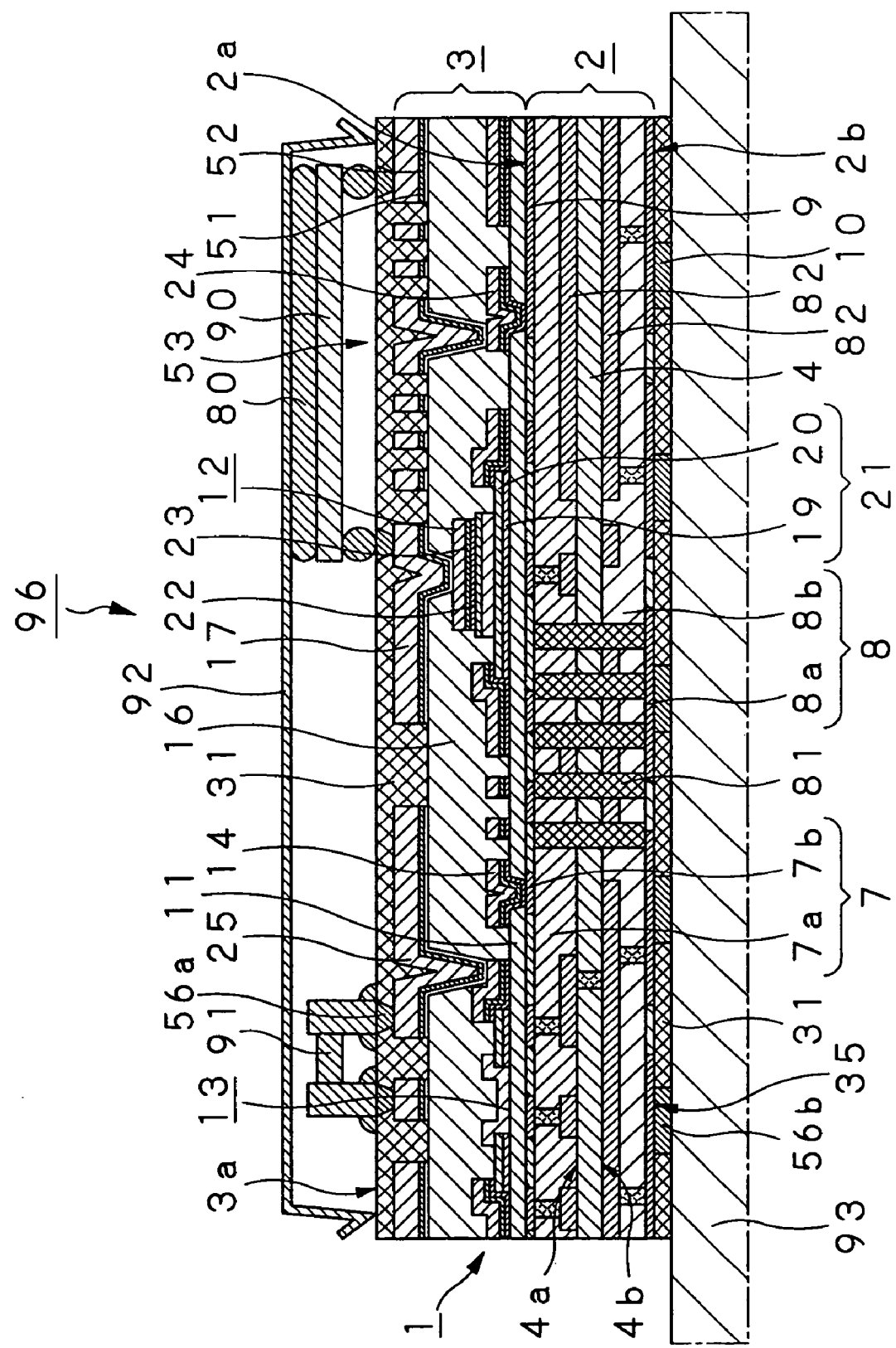
FIG. 48 is a main part longitudinally sectional view of a high frequency module device having another heat radiating mechanism.

In a high frequency module device 96 shown in FIG. 48, heat generated from the high frequency IC 90 or the chip parts 91 is more efficiently radiated. Many cooling vias 81 through which the base board 2 communicates with the circuit part 3 are formed as well as the above-described thermally conductive resin material 80 correspondingly to an area on which the high frequency IC 90 is mounted. These cooling vias 81 are formed in the same process as that used when the above-described vias for connecting circuits are respectively formed on the base board 2 or the circuit part 3.

In the high frequency module device 96 shown in FIG. 48, the heat generated from the high frequency IC 90 is radiated from the shield cover 92 through the thermally conductive resin material 80 as described above. Further, the heat is transferred to the bottom surface of the base board 2 through the cooling vias 81 and to an external part. The high frequency module device 96 may form the heat radiating structure only by the cooling vias 81. Further, the high frequency module device 96 may be formed in such a manner that, for instance, a copper foil part 82 formed on the core board 4 has thickness as large as 50 nm. Further, the cooling vias 81 may be respectively connected to the copper foil part 82 to radiate heat from the core board 4.

Figure 49:
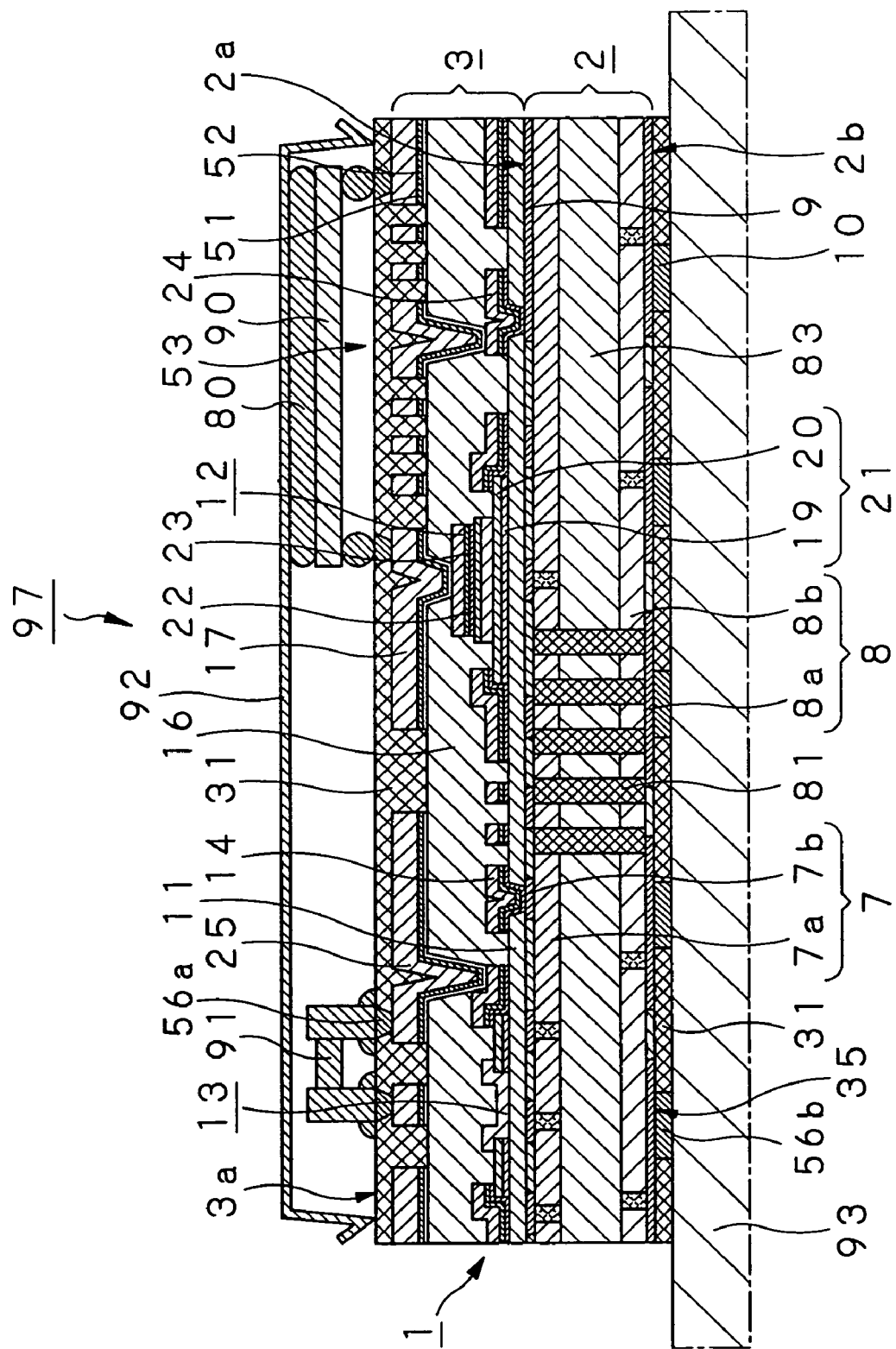
FIG. 49 is a main part longitudinally sectional view of a high frequency module device having other heat radiating mechanism.

In a high frequency module device 97 shown in FIG. 49, the circuit part 3 is formed on the base board 2 having a metal core such as copper, alloy good, etc. in its electric conductivity as a core board 83. In the high frequency module device 97, many cooling vias 81 are respectively formed so as to be connected to the core board 83. In the high frequency module device 97, heat is radiated from the core board 83 through the cooling vias 81. The above-described thermally conductive resin material 80 for radiating heat or the cooling vias 81 are formed so that a more efficient heat radiation is performed and reliability is improved.

In each of the above-described high frequency module devices, the base board 2 has the structure that the intermediate body 28 is formed. Further, the third resin coated copper foil 29 and the fourth resin coated copper foil 30 are bonded to both the main surfaces of the intermediate body 28. However, the circuit board 1 may have a structure that the circuit part 3 is formed on a base board 60 formed by using a method for manufacturing a second base board shown in FIGS. 50A to 50E.

Now, the method for manufacturing the second base board 60 will be described. In the manufacturing steps of the base board 60, the same base board 60 as the above-described base board 2 is manufactured by using two double-sided boards 61a and 61b. In the manufacturing steps of the base board 60, since individual steps are respectively the same as those of the above-described base board 2, the detailed description thereof will be omitted.

Figure 50A:
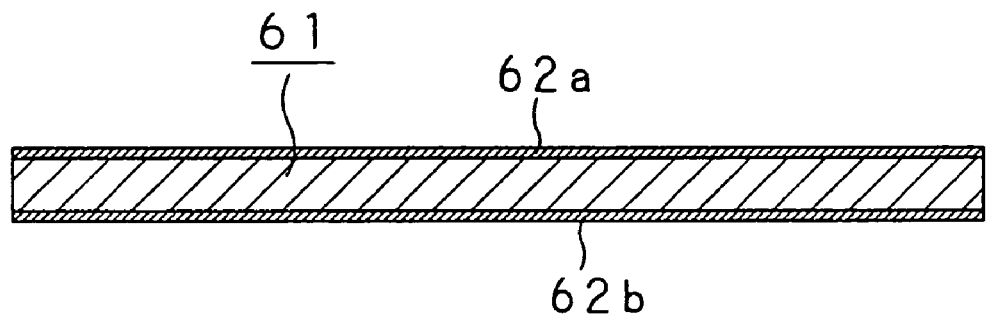
FIGS. 50A to 50F are views for explaining another method for manufacturing a base board.
Figure 50B:
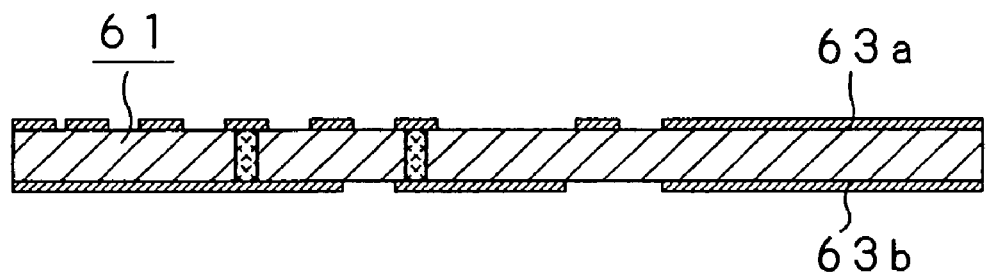
Figure 50C:
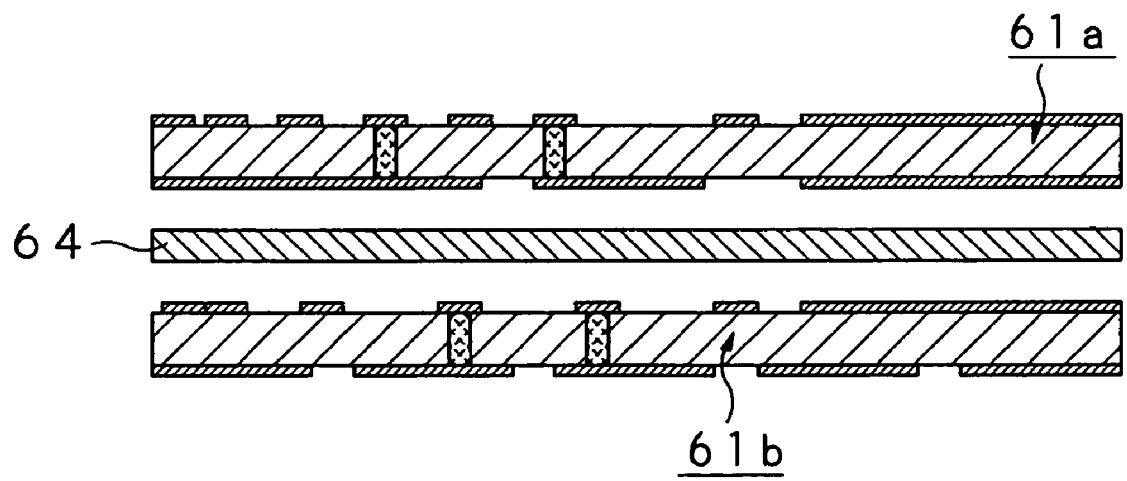
Figure 50D:
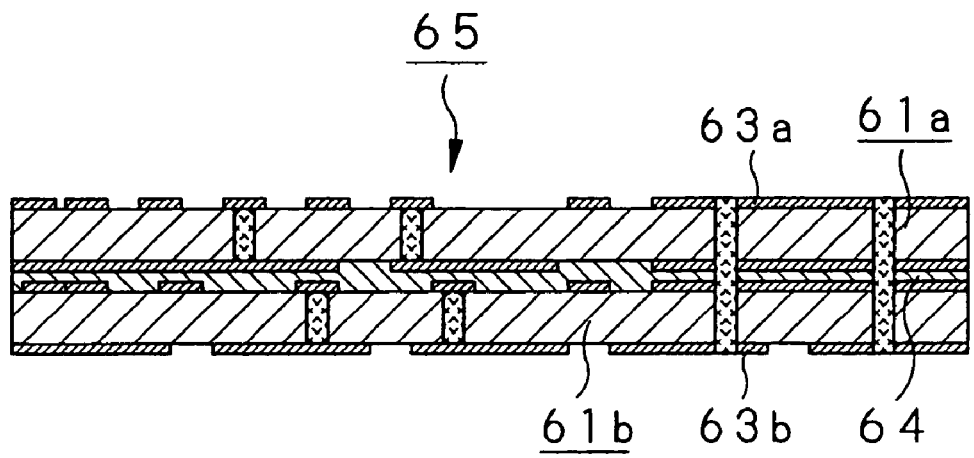

When the base board 60 is manufactured, a double-sided board 61 as shown in FIG. 50A is firstly prepared. Conductive layers 62a and 62b are formed on both the main surfaces of the double-sided board 61. Then, as shown in FIG. 50B, a photolithography process is applied to the conductive layers 62a and 62b of the double-sided board 61 to form prescribed patterns. An etching process is applied to pattern and form prescribed pattern wiring 63a and 63b. Then, as shown in FIG. 50C, the two double-sided boards 61 having the prescribed pattern wiring 63a and 63b formed are bonded together through, for instance, an intermediate resin material 64. Then, as shown in FIG. 50D, the pattern wiring 63a and 63b of the two double-sided boards 61 are respectively connected together through vias to form an intermediate body 65.

Figure 50E:
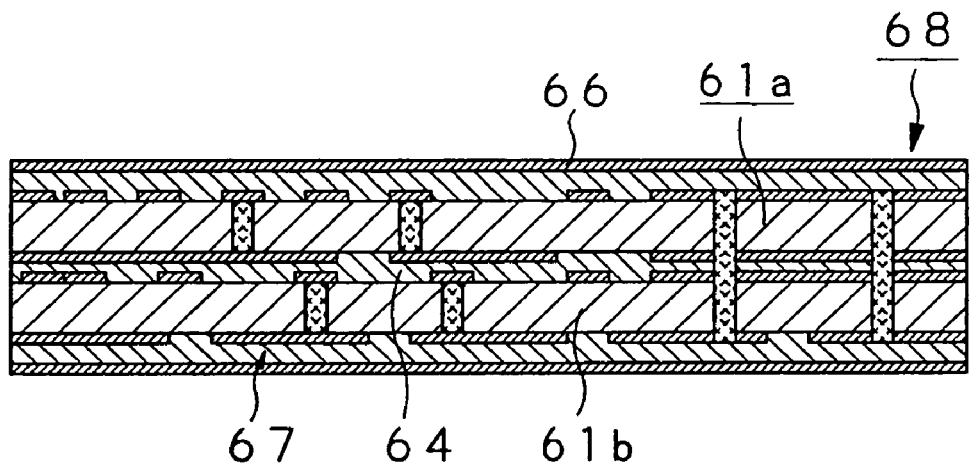
Figure 50F:
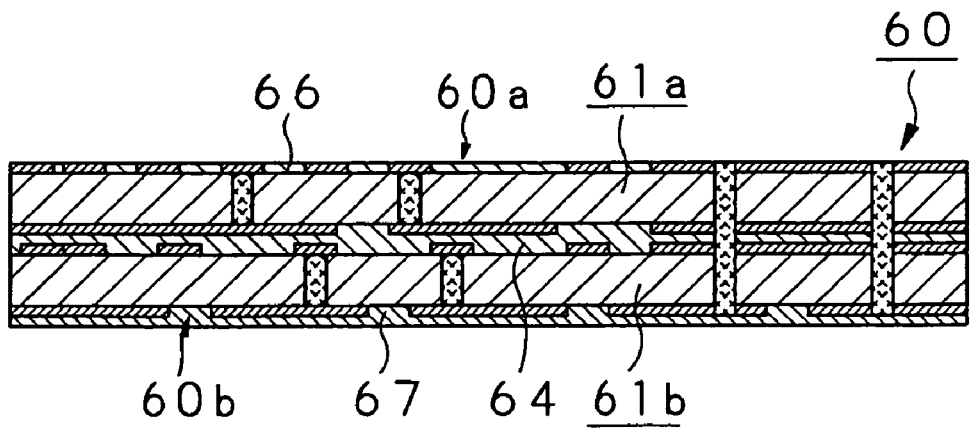

Then, as shown in FIG. 50E, a first resin coated copper foil 66 and a second resin coated copper foil 67 are respectively bonded to both the main front and back surfaces of the intermediate body 65 by a heat press. Then, as shown in FIG. 50F, the first resin coated copper foil 66 and the second resin coated copper foil 67 bonded to the intermediate body 65 are ground. In the side of the first resin coated copper foil 66, a grinding process is carried out until the pattern wiring 63a is exposed so that a highly accurately flattened build-up forming surface 60a is formed. On the other hand, in the side of the second resin coated copper foil 67, a grinding process is carried out in such a manner that the pattern wiring 63b is not exposed outward. The base board 60 is manufactured through the above-described steps.

The base board 60 is formed by using the two double-sided boards 61 as described above. However, the base board 1 may have a structure that the circuit part 3 is formed on a base board 70 formed by using a method for manufacturing a third base board as shown in FIGS. 51A to 51D.

Now, the method for manufacturing the third base board 70 will be described. In the manufacturing steps of the base board 70, liquid resin composed of, for instance, an insulating dielectric material is applied by a dip coat method to the main front and back surfaces of the intermediate body 65 shown in FIG. 51A. The intermediate body 65 is manufactured through the steps shown in FIGS. 50A to 50D. In the manufacturing steps of the base board 70, since the individual steps are respectively the same as those of the base board 2, the detailed description thereof will be omitted.

Figure 51A:
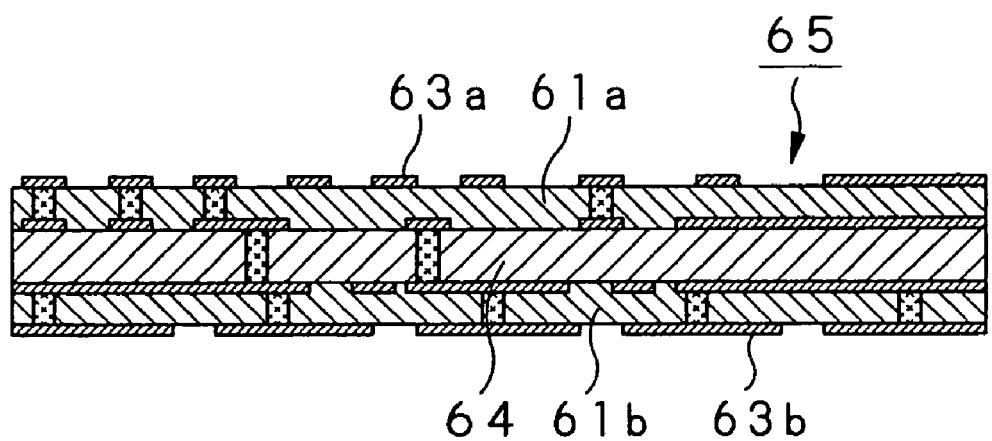
FIGS. 51A to 51D are views for explaining a method for manufacturing a base board by a dip coat method.
Figure 51B:
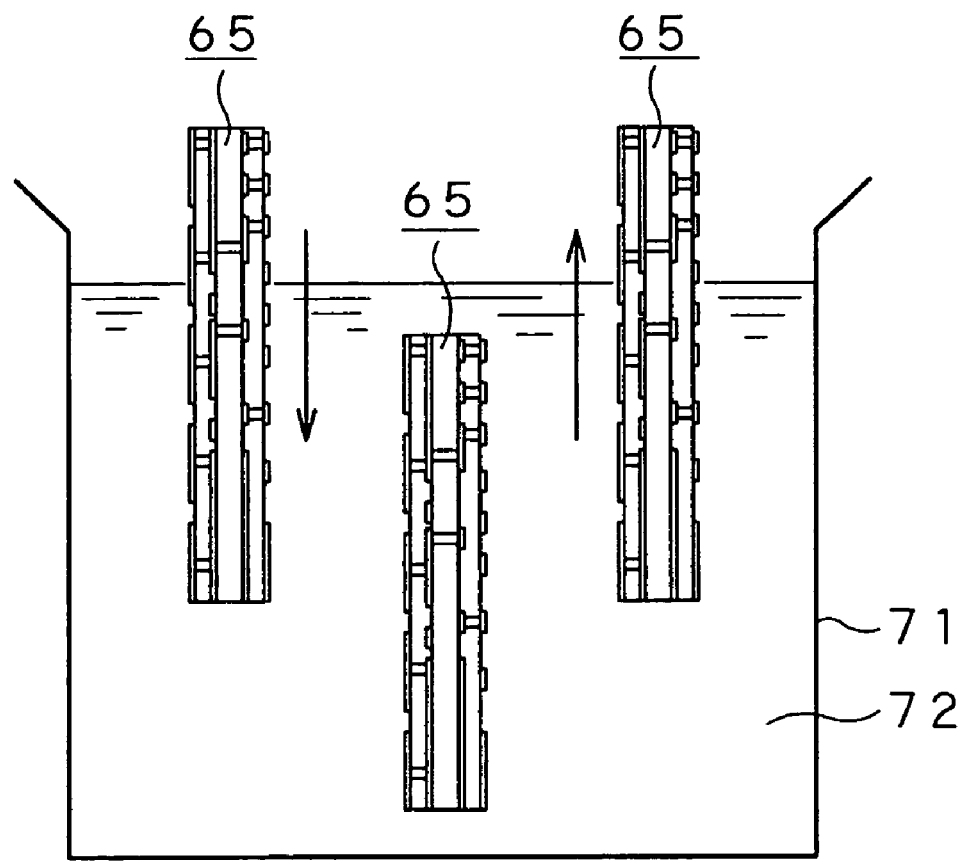
Figure 51C:
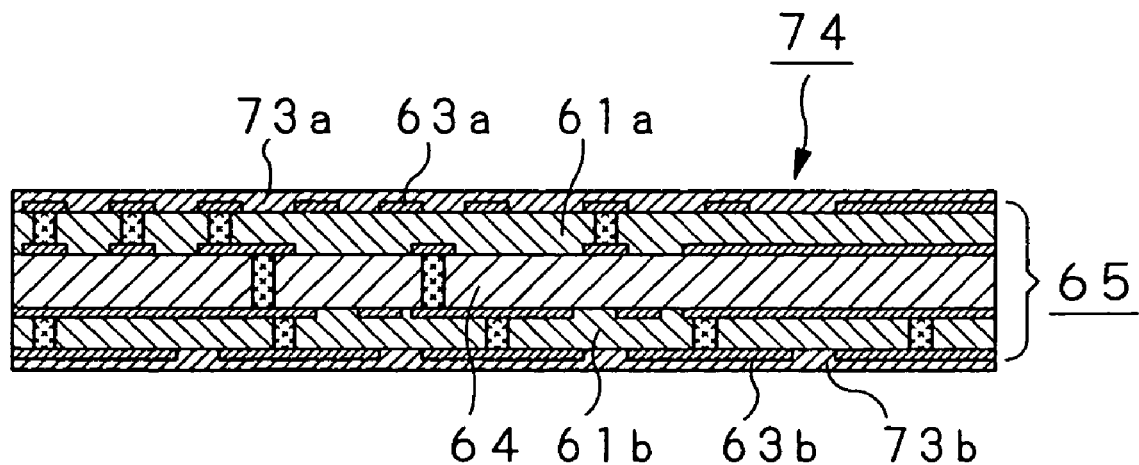

When the base board 70 is manufactured, as shown in FIG. 51B, the intermediate body 65 is firstly prepared. The intermediate body 65 is immersed in liquid resin material 72 dissolved in suitable solvent stored in a liquid storage vessel 71. After the intermediate body 65 is immersed in the liquid for a prescribed time, the intermediate body 65 is taken out from the liquid storage vessel 71 at prescribed pulling speed. Thus, as shown in FIG. 51C, the resin layers 73a and 73b of the liquid resin material 72 are formed on the main front and back surfaces of the intermediate body 65 at the same time.

Figure 51D:
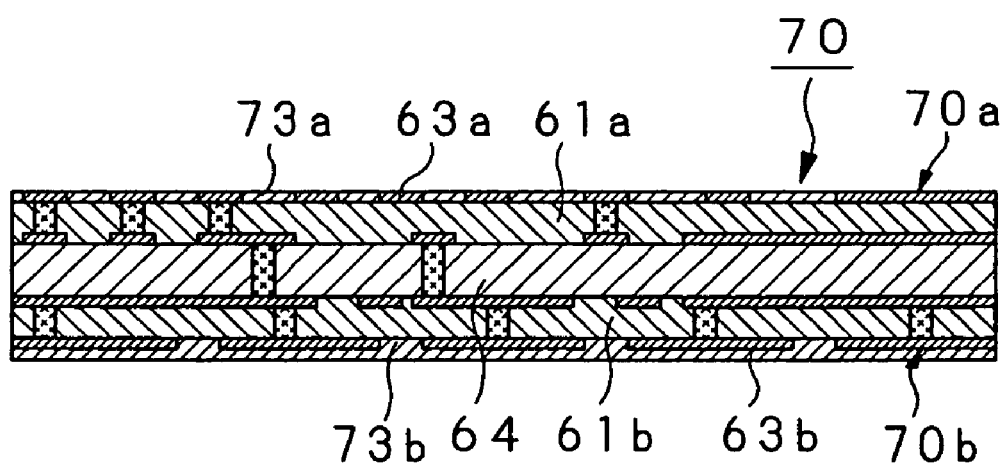

In such a way, the intermediate body 65 having the resin layers 73a and 73b formed is held in a horizontal state to apply a baking process thereto. Thus, excessive organic components are evaporated. Then, as shown in FIG. 51D, a grinding process is applied to the formed resin layers 73a and 73b. In the resin layer 73a, the grinding process is carried out until the pattern wiring 63a is exposed to form a highly accurately flattened build-up forming surface 70a. On the other hand, in the resin layer 73b, such a grinding process as to expose no pattern wiring 63b outward is carried out. The base board 70 is manufactured through the above-described steps.

INDUSTRIAL APPLICABILITY

As described above, according to the present invention, since the substrate titanium layer functions for improving the adhesion between the insulating layer, the receiving electrode parts and the passive element parts, and the substrate layer in the circuit part built up on the base board. The substrate titanium film serving as the substrate titanium layer functions as a protective film for preventing the receiving electrode parts or the passive elements from corroding by the etching liquid used when the substrate layer is patterned and formed by the wet type etching process. Thus, according to the present invention, the corrosion of the receiving electrode parts or the passive element parts is prevented and the deterioration of the passive element parts is suppressed. Further, the electric insulation failure between the passive element parts and the wiring layers is prevented. Therefore, the thin film circuit board device having the passive elements of high performance can be obtained.

According to the present invention, since the high density wiring such as the wiring layers having the passive element parts can be patterned and formed by the thin film technique, the thin film circuit board device can be made thinner and more compact. According to the present invention, the forming steps of the circuit part are repeated to form the wiring layers having the passive element parts in multi-layers not smaller than three layers. Thus, since the insulating layers of the base board and the circuit part can be formed by using the relatively inexpensive organic material, the thin film circuit board device can be inexpensively manufactured by suppressing a manufacture cost.

The invention claimed is:

1. A method for manufacturing a thin film circuit board device, the method comprising:
    forming a base board having a flattened main surface to serve as a build-up forming surface, said flattened main surface including a wiring pattern surface; and
    forming a circuit part which includes (a) insulating and wiring layers built up and formed on the build-up forming surface of the base board, (b) a receiving electrode part having a titanium layer and an electrode layer sequentially laminated on the insulating layer and (c) at least one of a capacitor part and a resistor part as a passive element part electrically connected to the receiving electrode part,
    wherein the circuit part forming step comprises:
        forming a substrate titanium film and a non-titanium substrate film sequentially laminated on the insulating layer so as to cover the receiving electrode part and the passive element part,
        forming and patterning a patterned metallic film on the non-titanium substrate film as the wiring layer,
        etching the non-titanium substrate film using a wet type etching to remove the non-titanium substrate film in an area in which the metallic film is not formed using the metallic film as a shield part to pattern and form a substrate layer, and
        etching the substrate titanium film using a wet type etching to remove the substrate titanium film in the area in which the metallic film is not formed to form and pattern a substrate titanium layer.

2. The method for manufacturing a thin film circuit board device according to claim 1, wherein the insulating layer is composed of at least one material selected from the group consisting of polyphenyl ethylene, bismaleimide triazine, polyimide, liquid crystal polymer, polynorbornene, benzocyclobutene, an epoxy resin material, and an acrylic resin material.

3. The method for manufacturing a thin film circuit board device according to claim 1, wherein the wiring layers are made of copper or a metallic material including copper.

4. The method for manufacturing a thin film circuit board device according to claim 1, wherein the passive element part has layers composed of tantalum nitride or tantalum.

5. The method for manufacturing a thin film circuit board device according to claim 1, wherein the non-titanium substrate film is formed with any one or a mixture of a plurality of kinds of materials selected from the group consisting of copper, aluminum, gold, and platinum.

6. The method for manufacturing a thin film circuit board device according to claim 2, wherein the base board has wiring layers formed in multi-layers on a main surface of a core board.

7. The method for manufacturing a thin film circuit board device according to claim 6, wherein the core board is an organic board selected from the group consisting: a double-sided board made of any one or a mixture of a plurality of kinds of materials selected from the group consisting of polyphenyl ethylene, bismaleimide triazine, polyimide, liquid crystal polymer, polynorbornene, benzocyclobutene; a double-sided board made of a mixture of ceramic and an organic material, and an epoxy double-sided board.

* * * * *